(12) United States Patent
An et al.

(10) Patent No.: US 12,429,917 B2
(45) Date of Patent: Sep. 30, 2025

(54) ELECTRONIC DEVICE INCLUDING FLEXIBLE DISPLAY

(71) Applicant: Samsung Electronics Co., Ltd., Suwon-si (KR)

(72) Inventors: Jungchul An, Suwon-si (KR); Sangkyu Kim, Suwon-si (KR); Shinhyuk Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 166 days.

(21) Appl. No.: 18/451,741

(22) Filed: Aug. 17, 2023

(65) Prior Publication Data

US 2024/0061472 A1 Feb. 22, 2024

Related U.S. Application Data

(63) Continuation of application No. PCT/KR2023/011028, filed on Jul. 28, 2023.

(30) Foreign Application Priority Data

| Aug. 16, 2022 | (KR) | ......................... | 10-2022-0101978 |
| Aug. 25, 2022 | (KR) | ......................... | 10-2022-0106738 |

(51) Int. Cl.
    *G06F 1/16*      (2006.01)
    *B32B 7/12*      (2006.01)
    (Continued)

(52) U.S. Cl.
    CPC .............. *G06F 1/1652* (2013.01); *B32B 7/12* (2013.01); *B32B 17/10* (2013.01); *B32B 27/08* (2013.01);
    (Continued)

(58) Field of Classification Search
    CPC ...... G06F 1/1616; G06F 1/1652; H10K 77/10
    See application file for complete search history.

(56) References Cited

U.S. PATENT DOCUMENTS

10,892,443 B2    1/2021    Ahn et al.
11,197,380 B2    12/2021    An
(Continued)

FOREIGN PATENT DOCUMENTS

| CN | 211087782 U | 7/2020 |
| CN | 212684943 U | 3/2021 |

(Continued)

OTHER PUBLICATIONS

Search Report and Written Opinion dated Oct. 25, 2023 issued in International Patent Application No. PCT/KR2023/011028.
(Continued)

*Primary Examiner* — Nathan Milakovich
(74) *Attorney, Agent, or Firm* — Nixon & Vanderhye, P.C.

(57) ABSTRACT

According to various embodiments, an electronic device may include: a first housing; a second housing; a hinge device connecting the first housing and the second housing in a foldable manner; and a flexible display disposed to be supported by the first housing and the second housing, and including a display panel and a protection layer laminated on the display panel. The protection layer of the flexible display may include a first layer laminated on the display panel; a second layer laminated on the first layer; a third layer laminated on the second layer; and a coating layer formed on an upper surface of the third layer, wherein the third layer has a thickness greater than a thickness of the second layer.

20 Claims, 14 Drawing Sheets

(51) Int. Cl.
  *B32B 17/10* (2006.01)
  *B32B 27/08* (2006.01)
  *B32B 33/00* (2006.01)

(52) U.S. Cl.
  CPC ............ *B32B 33/00* (2013.01); *G06F 1/1616* (2013.01); *B32B 2250/03* (2013.01); *B32B 2255/10* (2013.01); *B32B 2307/7375* (2023.05); *B32B 2457/20* (2013.01)

(56) References Cited

U.S. PATENT DOCUMENTS

| | | | |
|---|---|---|---|
| 11,485,114 | B2 | 11/2022 | Ahn et al. |
| 11,762,416 | B2 | 9/2023 | Gu et al. |
| 11,947,205 | B2 | 4/2024 | Su et al. |
| 2016/0101593 | A1 | 4/2016 | Nam et al. |
| 2018/0231692 | A1 | 8/2018 | Ham et al. |
| 2018/0342566 | A1 | 11/2018 | Khachatryan et al. |
| 2019/0080962 | A1 | 3/2019 | Zhang et al. |
| 2020/0194724 | A1 | 6/2020 | Ahn et al. |
| 2021/0323275 | A1 | 10/2021 | Ahn et al. |
| 2021/0349242 | A1 | 11/2021 | Yoo et al. |
| 2022/0118744 | A1 | 4/2022 | Ouyang et al. |
| 2022/0140263 | A1 | 5/2022 | Liu et al. |
| 2022/0312612 | A1 | 9/2022 | An et al. |

FOREIGN PATENT DOCUMENTS

| | | |
|---|---|---|
| CN | 215182809 U | 12/2021 |
| KR | 10-2018-0094348 | 8/2018 |
| KR | 10-2018-0107152 | 10/2018 |
| KR | 10-2018-0130079 | 12/2018 |
| KR | 10-2020-0041042 | 4/2020 |
| KR | 10-2022-0053464 | 4/2022 |
| KR | 20220053464 A | 4/2022 |
| WO | 2022085915 A1 | 4/2022 |

OTHER PUBLICATIONS

Extended European Search Report dated Jul. 9, 2025 issued in European Patent Application No. 23855073.5.

ELECTRONIC DEVICE INCLUDING FLEXIBLE DISPLAY

CROSS-REFERENCE TO RELATED APPLICATIONS

This application is a continuation of International Application No. PCT/KR2023/011028 designating the United States, filed on Jul. 28, 2023, in the Korean Intellectual Property Receiving Office and claiming priority to Korean Patent Application No. 10-2022-0101978, filed on Aug. 16, 2022, and to Korean Patent Application No. 10-2022-0106738, filed on Aug. 25, 2022, in the Korean Intellectual Property Office, the disclosures of all of which are incorporated by reference herein in their entireties.

BACKGROUND

Field

The disclosure relates to an electronic device including a flexible display.

Description of Related Art

An electronic device has gradually become slimmer, and has been improved so as to increase rigidity, reinforce the design aspect, and differentiate functional elements thereof at the same time. Electronic devices have deviated from the uniform rectangular shape, and have been gradually changed to various shapes. The electronic device may have a transformable structure which is convenient to carry and which can use a large-screen display. For example, as part of the transformable structure, the electronic device may include foldable housings which operate to fold or unfold each other. Such an electronic device may require a support structure which can reduce the deformation of the flexible display due to frequent folding operations.

A foldable electronic device may include a hinge device (e.g., a hinge structure or hinge module), and a first housing and a second housing which are connected in a foldable manner in a direction in which they face each other through the hinge device. Such a foldable electronic device may operate in an in-folding and/or out-folding manner that the first housing is rotated within a range of 0 to 360 degrees against the second housing through the hinge module. The foldable electronic device may include a flexible display disposed to be supported at least partly through the first housing and the second housing in an unfolding state of the foldable electronic device. Such a flexible display may include a plurality of layers (e.g., a protection layer, a POL, a polymer layer, or at least one functional layer) disposed on an upper surface and/or a lower surface based on a display panel.

Meanwhile, the flexible display may include the protection layer (e.g., a window layer) laminated on the upper surface of the display. The protection layer may include a glass layer (e.g., UTG or ultra-thin glass) laminated on the display panel and the polymer layer laminated on the glass layer. The flexible display may include a folding area located in an area corresponding to boundary areas of the first housing and the second housing in accordance with a folding operation. The folding area may be transformed by folding and unfolding operations of the electronic device. The protection layer may be folding together with the display panel in accordance with the folding operation, and may be restored to the original state together with the display panel in the unfolding state, but a part of the protection layer, such as the polymer layer may not be restored to the original state due to burnout deformation. Such burnout deformation may be formed in a length direction along a folding axis on left and right sides of the folding area of the flexible display, and may cause formation of a crease area that is visually identified. For example, the crease area may cause deterioration of the surface quality of the flexible display, and reliability of the electronic device may be degraded through visually recognized by a user. Further, in accordance with frequent folding operations, defects may be caused due to delamination between the display panel and the protection layer in the folding area.

SUMMARY

Embodiments of the disclosure may provide an electronic device including a flexible display having a laminated structure that can help improvement of the surface quality.

Embodiments of the disclosure may provide an electronic device including a flexible display that can help improvement of the durability of the flexible display even when used for a long time.

However, problems to be addressed by the disclosure are not limited to the above-mentioned problems, but can be variously expanded in a range that does not deviate from the idea and scope of the disclosure.

According to various example embodiments, an electronic device may include: a first housing; a second housing; a hinge device including a hinge connecting the first housing and the second housing in a foldable manner; and a flexible display supported by the first housing and the second housing, and including a display panel and a protection layer laminated on the display panel. The protection layer of the flexible display may include a first layer laminated on the display panel; a second layer laminated on the first layer; a third layer laminated on the second layer; and a coating layer formed on an upper surface of the third layer, wherein the third layer is formed to have a thickness thicker than a thickness of the second layer.

Since the electronic device according to various example embodiments of the disclosure includes a plurality of laminated protection layers while maintaining the overall thickness of the protection layers, it can reduce the formation of the crease area by reducing the burnout deformation of the protection layers due to the frequent folding operation, help the improvement of the surface quality, and help the reduction of the defect phenomenon, such as the delamination.

In addition, various effects achieved directly or indirectly through this disclosure can be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1A:
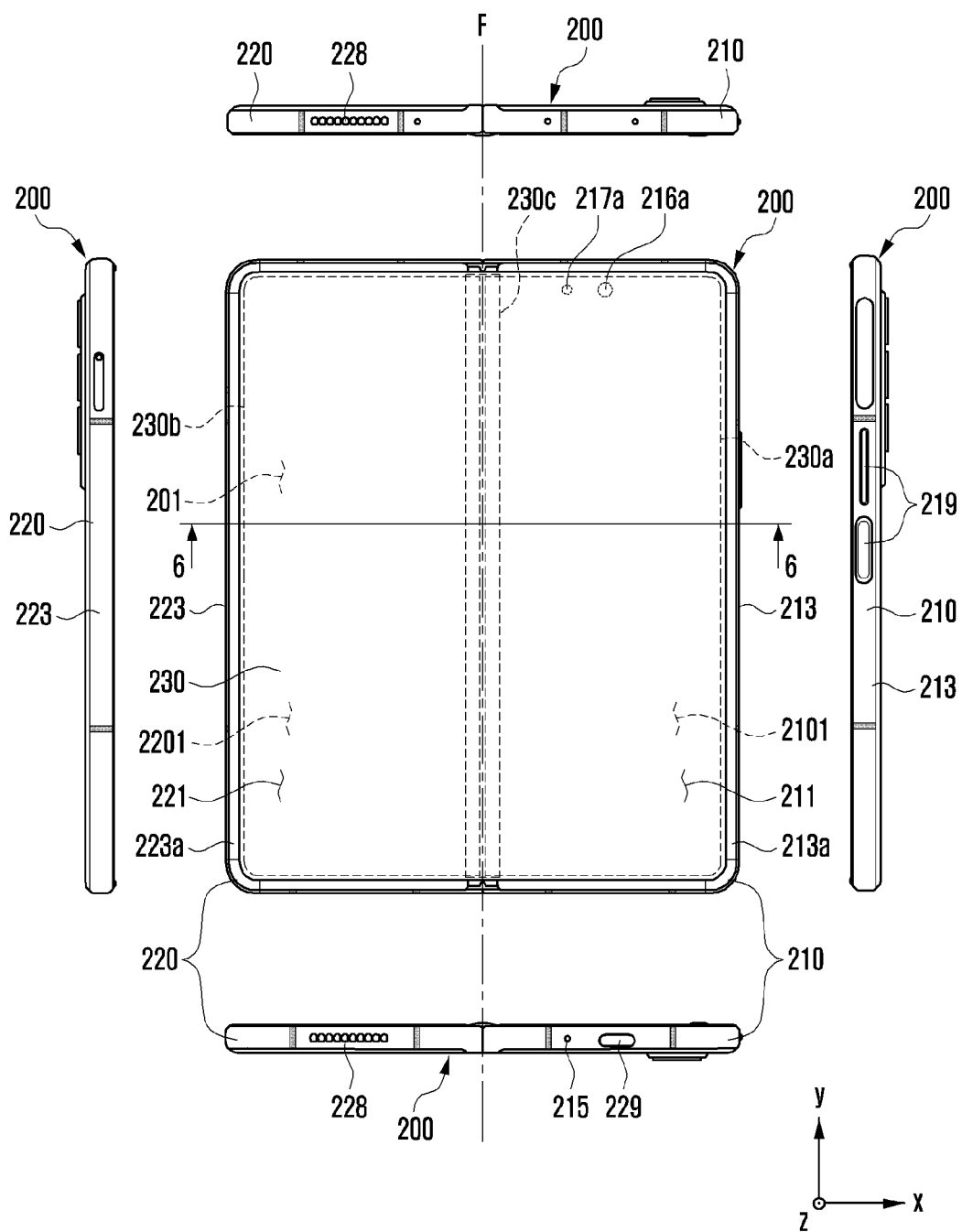
FIG. 1A is a front perspective view of an electronic device illustrating an unfolding state (or flat state) according to various embodiments.
Figure 1B:
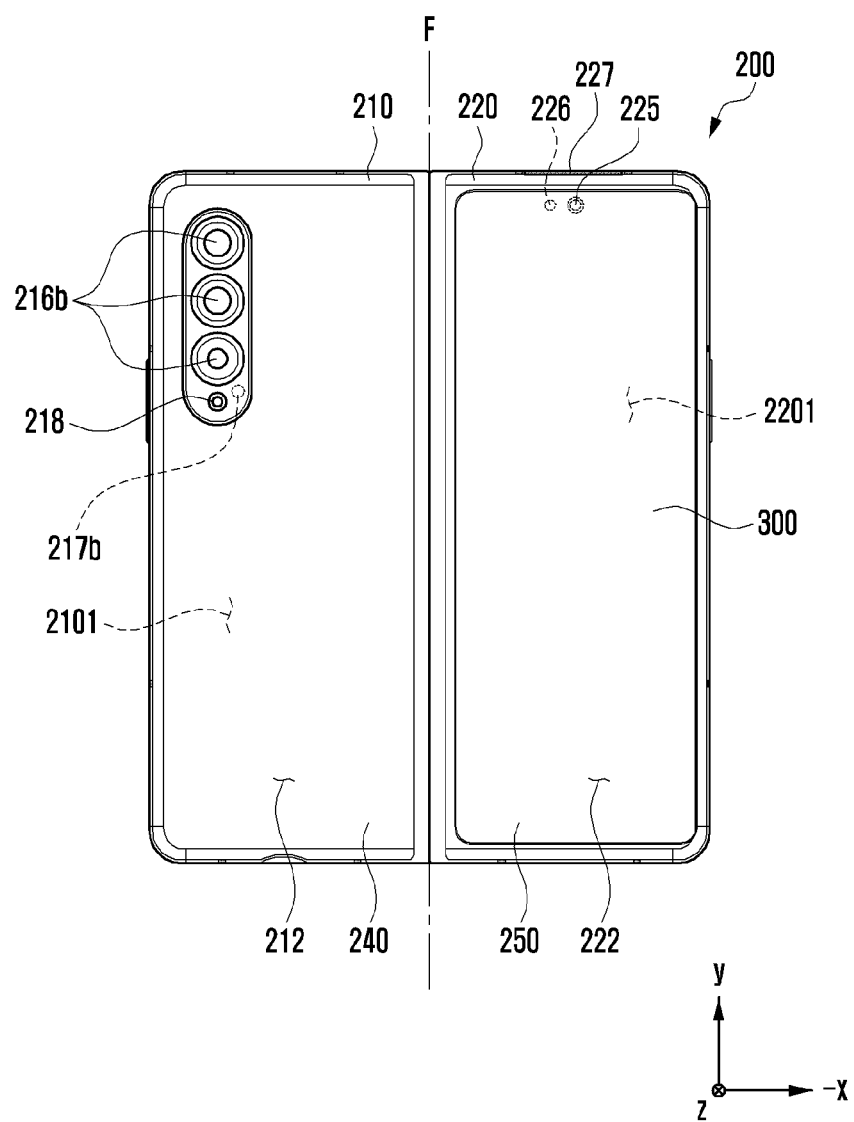
FIG. 1B is a diagram illustrating a rear surface of an electronic device in an unfolding state according to various embodiments.
Figure 2A:
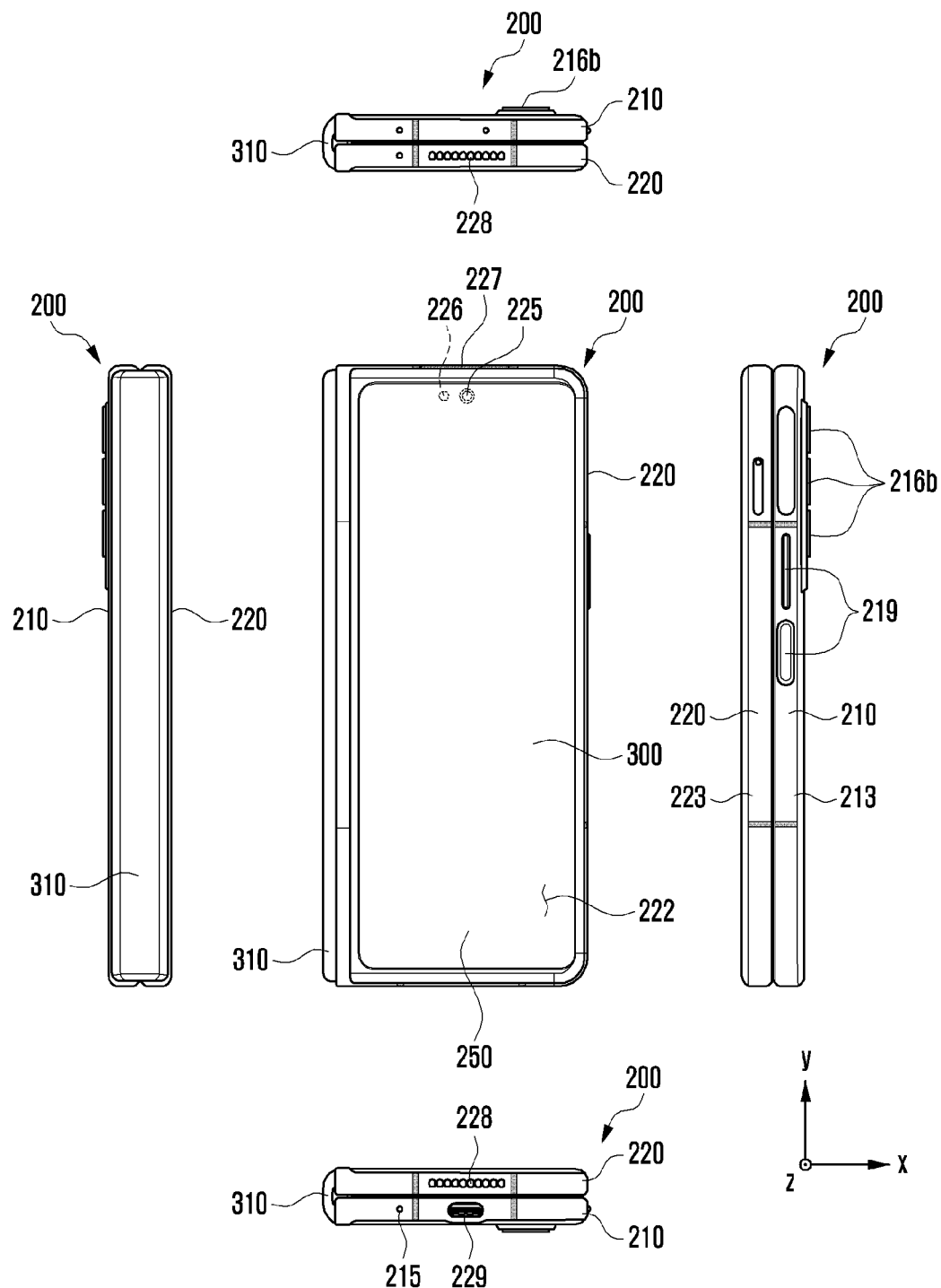
FIG. 2A is a perspective view of an electronic device illustrating a folding state according to various embodiments.
Figure 2B:
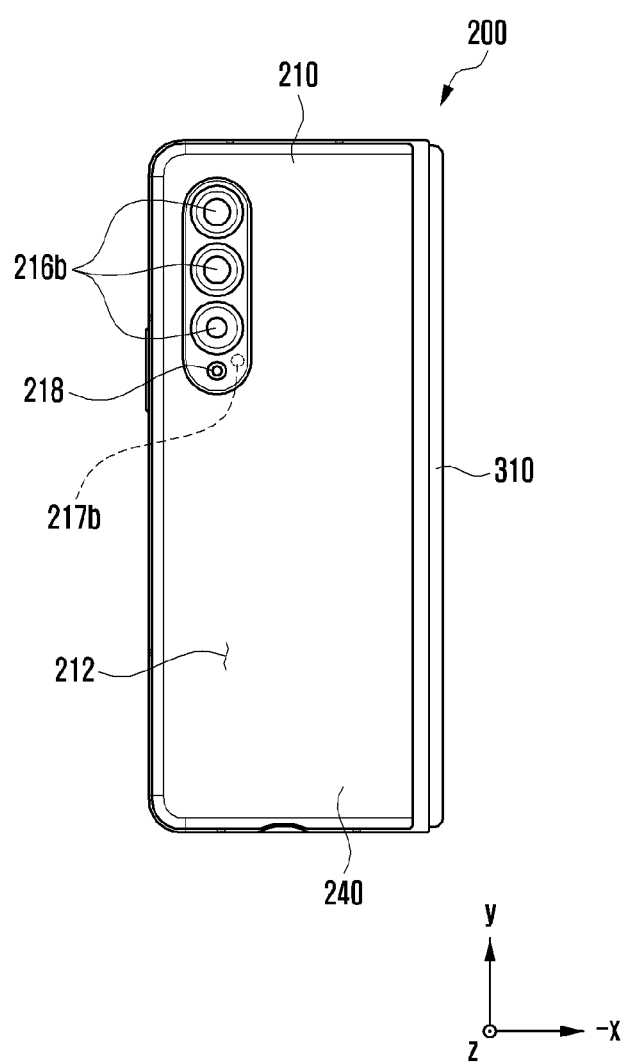
FIG. 2B is a rear perspective view of an electronic device illustrating an folding state according to various embodiments.

FIGS. 1A and 1B are diagrams illustrating a front view and a rear view, respectively, of an unfolded state of an electronic device according to various embodiments. FIGS. 2A and 2B are diagrams illustrating a front view and a rear view, respectively, of a folded state of an electronic device according to various embodiments.

Referring to FIGS. 1A, 1B, 2A and 2B (which may be referred to as FIGS. 1A to 2B), an electronic device 200 may include a pair of housings 210 and 220 (e.g., a foldable housing structure) rotatably coupled to each other with reference to folding axis A through a hinge device (e.g., a hinge device 320 of FIG. 3) (e.g., a hinge module) so as to be folded with respect to each other, a first display 230 (e.g., a flexible display, a foldable display, or a main display) disposed through the pair of housings 210 and 220, and/or a second display 300 (e.g., a sub display) disposed through the second housing 220. According to an embodiment, at least a part of the hinge device (e.g., the hinge device 320 of FIG. 3) may be disposed so as not to be seen from the outside through the first housing 210 and the second housing 220, and may be disposed so as not to be seen from the outside through the hinge housing 310 covering a foldable portion. According to an embodiment, the hinge device 320 may include a hinge module including a gear assembly including multiple gears and multiple hinge cams which are coupled to hinge shafts rotating through the gear assembly and perform a cam interlocking operation, and hinge plates for connecting the hinge model to the first housing 210 and the second housing 220. In the disclosure, a surface in which the first display 230 is disposed may be defined as a front surface of the electronic device 200, and a surface opposite to the front surface may be defined as a rear surface of the electronic device 200. In addition, a surface surrounding a space between the front surface and the rear surface may be defined as a side surface of the electronic device 200.

Figure 3:
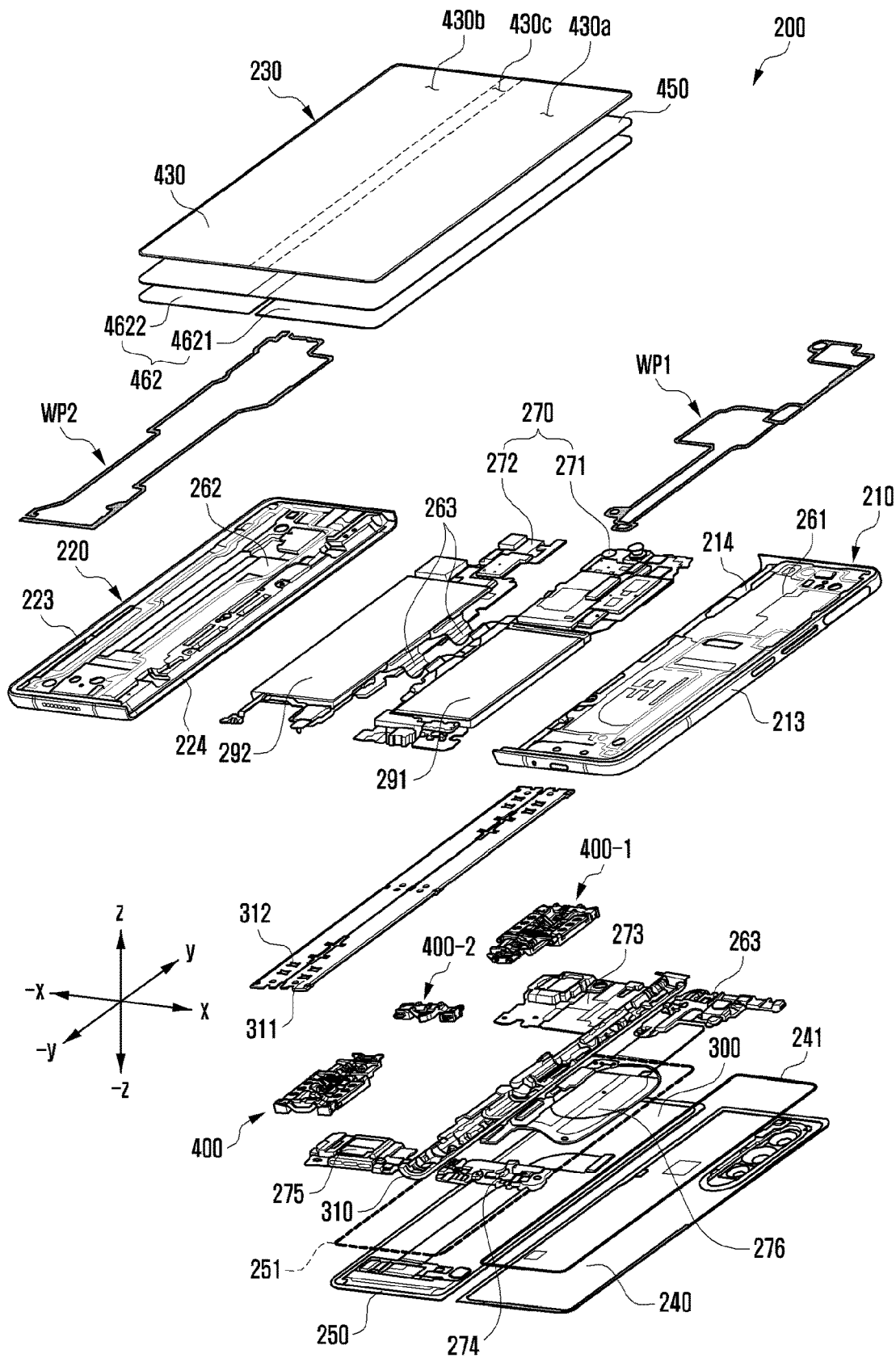
FIG. 3 is an exploded perspective view of an electronic device according to various embodiments.

According to various embodiments, the pair of housings 210 and 220 may include a first housing 210 and a second housing 220 foldably arranged with respect to each other through the hinge device (e.g., the hinge device 320 of FIG. 3). According to an embodiment, the shape and the coupling of the pair of housings 210 and 220 are not limited to those illustrated in FIGS. 1A to 2B, and the pair of housings 210 and 220 may be implemented by a combination and/or coupling of other shapes or components. According to an embodiment, the first housing 210 and the second housing 220 may be arranged on opposite sides with reference to the folding axis A, and may have shapes that are entirely symmetric to each other with respect to the folding axis A. According to an embodiment, the first housing 210 and the second housing 220 may be asymmetrically folded with reference to the folding axis A. According to an embodiment, the angle or the distance between the first housing 210 and the second housing 220 may vary depending on whether the electronic device 200 is in an unfolded state, a folded state, or an intermediate state.

According to various embodiments, the first housing 210 may include, in the unfolded state of the electronic device 200, a first surface 211 connected to the hinge device (e.g., the hinge device 320 of FIG. 3) and disposed to be oriented to the front surface of the electronic device 200, a second surface 212 oriented in a direction opposite to the first surface 211, and/or a first side member 213 surrounding at least a part of a first space between the first surface 211 and the second surface 212. According to an embodiment, the second housing 220 may include, in the unfolded state of the electronic device 200, a third surface 221 connected to the hinge device (e.g., the hinge device 320 of FIG. 3) and disposed to be oriented to the front surface of the electronic device 200, a fourth surface 222 oriented in a direction opposite to the third surface 221, and/or a second side member 223 surrounding at least a part of a second space between the third surface 221 and the fourth surface 222. According to an embodiment, the first surface 211 and the third surface 221 may be oriented in substantially the same direction in the unfolded state, and the first surface 211 and the third surface 221 may at least partially face each other in the folded state. According to an embodiment, the electronic device 200 may include a recess 201 formed to receive the first display 230 through structural coupling of the first housing 210 and the second housing 220. According to an embodiment, the recess 201 may have substantially the same shape as the first display 230. According to an embodiment, the first housing 210 may include a first protection frame 213a (e.g., a first decoration member) which is, when seen from above the first display 230, coupled to the first side member 213, disposed to overlap with an edge of the first display 230, so as to cover the edge of the first display 230 to allow the same not to be seen from the outside. According to an embodiment, the first protection frame 213a may be integrally formed with the first side member 213. According to an embodiment, the second housing 220 may include a second protection frame 223a (e.g., a second decoration member) which is, when seen from above the first display 230, coupled to the second side member 223, disposed to overlap with an edge of the first display 230, so as to cover the edge of the first display 230 to allow the same not to be seen from the outside. According to an embodiment, the second protection frame 223a may be integrally formed with the first side member 223. In an embodiment, the first protection frame 213a and the second protection frame 223a may be omitted.

According to various embodiments, the hinge housing 310 (e.g., a hinge cover) may be disposed between the first housing 210 and the second housing 220, and may be disposed to cover a part (e.g., at least one hinge module) of the hinge device (e.g., the hinge device 320 of FIG. 3) disposed on the hinge housing 310. According to an embodiment, the hinge housing 310 may be hidden or exposed from or to the outside by a part of the first housing 210 and the second housing 220 according to the unfolded state, the folded state, or the intermediate state of the electronic device 200. For example, when the electronic device 200 is in the unfolded state, at least a part of the hinge housing 310 may be covered by the first housing 210 and the second housing 220 and not be substantially exposed. According to an embodiment, when the electronic device 200 is in the folded state, at least a part of the hinge housing 310 may be exposed to the outside between the first housing 210 and the second housing 220. According to an embodiment, in the intermediate state in which the first housing 210 and the second housing 220 are folded with each other by a predetermined angle (folded with a certain angle), the hinge housing 310 may be at least partially exposed to the outside of the electronic device 200 between the first housing 210 and the second housing 220. For example, an area in which the hinge housing 310 is exposed to the outside, may be smaller than that in a case in which the electronic device 200 is completely folded. According to an embodiment, the hinge housing 310 may include a curved surface.

According to various embodiments, when the electronic device 200 is in the unfolded state (e.g., the states shown in FIGS. 1A and 1B), the first housing 210 and the second housing 220 may meet at an about 180-degree angle, and a first area 230a, a second area 230b, and a folding area 230c of the first display 230 may form the same plane and arranged to be oriented in substantially the same direction (e.g., a z-axis direction). In an embodiment, when the electronic device 200 is in the unfolded state, the first housing 210 may rotate by an about 360-degree angle with respect to the second housing 220, and may be outwardly folded (an out-folding scheme) so that the second surface 212 and the fourth surface 222 face each other.

According to various embodiments, when the electronic device 200 is in the folded state (e.g., the states shown in FIGS. 2A and 2B), the first surface 211 of the first housing 210 and the third surface 221 of the second housing 220 may be arranged to face each other. In this case, the first area 230a and the second area 230b of the first display 230 may form a narrow angle (e.g., a range between 0 degrees to about 10 degrees) through the folding area 230c, and may be arranged to face each other. According to an embodiment, at least a part of the folding area 230c may be deformed into a curved shape having a predetermined curvature. According to an embodiment, when the electronic device 200 is in the intermediate state, the first housing 210 and the second housing 220 may be arranged at a predetermined angle (a certain angle). In this case, the first area 230a and the second area 230b of the first display 230 may form an angle that is greater than that in the folded state and smaller than that in the unfolded state, and the curvature of the folding area 230c may be lower than that in the folded state, and may be higher than that in the unfolded state. In an embodiment, the first housing 210 and the second housing 220 may form an angle which allows stopping at a designated folding angle between the folded state and the unfolded state (a free stop function), through the hinge device (e.g., the hinge device 320 of FIG. 3). In an embodiment, the first housing 210 and the second housing 220 may continuously operate while being pressed in an unfolding direction or a folding direction with reference to a designated inflection angle, through the hinge device (e.g., the hinge device 320 of FIG. 3).

According to various embodiments, the electronic device 200 may include at least one of at least one display 230 and 300 disposed on the first housing 210 and/or the second housing 220, an input device 215, sound output devices 227 and 228, sensor modules 217a, 217b, and 226, camera modules 216a, 216b, and 225, a key input device 219, an indicator (not shown), or a connector port 229. In an embodiment, the electronic device 200 may omit at least one of the elements, or may additionally include at least one another element.

According to various embodiments, the at least one display 230 and 300 may include a first display 230 (e.g., a flexible display) disposed to be supported by the third surface 221 of the second housing 220 from the first surface 211 of the first housing 210 through the hinge device (e.g., the hinge device 320 of FIG. 3), and a second display 300 disposed to be at least partially seen from the outside through the fourth surface 222 in a space in the second housing 220. In an embodiment, the second display 300 may be disposed to be seen from the outside through the second surface 212 in a space in the first housing 210. According to an embodiment, the first display 230 may be mainly used in the unfolded state of the electronic device 200, and the second display 300 may be mainly used in the folded state of the electronic device 200. According to an embodiment, the electronic device 200 may control, in the intermediate state, the first display 230 and/or the second display 300 to be used, based on a folding angle between the first housing 210 and the second housing 220.

According to various embodiments, the first display 230 may be disposed in a receiving space formed by the pair of housings 210 and 220. For example, the first display 200 may be disposed in a recess 201 formed by the pair of housings 210 and 220, and may be disposed to occupy substantially the most of the front surface of the electronic device 200 in the unfolded state. According to an embodiment, the first display 230 may include a flexible display having at least one area which can be deformed into a plane or a curved surface. According to an embodiment, the first display 230 may include the first area 230a facing the first housing 210 and the second area 230b facing the second housing 220. According to an embodiment, the first display 230 may include the folding area 230c including a part of the first area 230a and a part of the second area 230b with respect to the folding axis A. According to an embodiment, at least a part of the folding area 230c may include an area corresponding to the hinge device (e.g., the hinge device 320 of FIG. 3). According to an embodiment, a division of an area of the first display 230 merely corresponds to an example physical division by the pair of housings 210 and 220 and the hinge device (e.g., the hinge device 320 of FIG. 3), and the first display 230 may be substantially displayed as one seamless full screen through the pair of the housings 210 and 220 and the hinge device (e.g., the hinge device 320 of FIG. 3). According to an embodiment, the first area 230a and the second area 230b may have shapes that are entirely symmetric or partially asymmetric to each other with respect to the folding area 230c.

According to various embodiments, the electronic device 200 may include a first rear cover 240 disposed on the second surface 212 of the first housing 210 and a second rear cover 250 disposed on the fourth surface 222 of the second housing 220. In an embodiment, at least a part of the first rear cover 240 may be integrally formed with the first side member 213. In an embodiment, at least a part of the second rear cover 250 may be integrally formed with the second side member 223. According to an embodiment, at least one of the first rear cover 240 and the second rear cover 250 may be substantially formed of a transparent plate (e.g., a polymer plate or glass plate including various coding layers) or an opaque plate. According to an embodiment, the first rear cover 240 may be formed of, for example, an opaque plate such as coded or colored glass, ceramic, polymer, metal (e.g., aluminum, stainless steel (STS), or magnesium), or a combination of at least two of the materials above. According to an embodiment, the second rear cover 250 may be substantially formed of, for example, a transparent plate such as glass or polymer. Accordingly, the second display 300 may be disposed to be seen from the outside through the second rear cover 250 in a space in the second housing 220.

According to various embodiments, the input device 215 may include a microphone. In an embodiment, the input device 215 may include multiple microphones arranged to detect the direction of sound. According to an embodiment, the sound output devices 227 and 228 may include speakers. According to an embodiment, the sound output devices 227 and 228 may include a call receiver 227 disposed through the fourth surface 222 of the second housing 220 and an external speaker 228 disposed through at least a part of the second side member 223 of the second housing 220. In an embodiment, the input device 215, the sound output devices 227 and 228, and the connector 229 may be disposed in spaces of the first housing 210 and/or the second housing 220, and may be exposed to an external environment through at least one hole formed through the first housing 210 and/or the second housing 220. In an embodiment, holes formed through the first housing 210 and/or the second housing 220 may be commonly used for the input device 215 and the sound output devices 227 and 228. In an embodiment, the sound output devices 227 and 228 may include a speaker (e.g., a piezo speaker) operating without including a hole formed through the first housing 210 and/or the second housing 220.

According to various embodiments, the camera modules 216a, 216b, and 225 may include a first camera module 216a disposed on the first surface 211 of the first housing 210, a second camera module 216b disposed on the second surface 212 of the first housing 210, and/or a third camera module 225 disposed on the fourth surface 222 of the second housing 220. According to an embodiment, the electronic device 200 may include a flash 218 disposed around the second camera module 216b. According to an embodiment, the flash 218 may include, for example, a light-emitting diode or a xenon lamp. According to an embodiment, the camera modules 216a, 216b, and 225 may include one or multiple lenses, an image sensor, and/or an image signal processor. In an embodiment, at least one of the camera modules 216a, 216b, and 225 may include two or more lenses (e.g., wide-angle and telephoto lenses) and image sensors, and may be arranged together on one surface of the first housing 210 and/or the second housing 220.

According to various embodiments, the sensor modules 217a, 217b, and 226 may generate a data value or an electrical signal corresponding to an internal operational state or an external environmental state of the electronic device 200. According to an embodiment, the sensor modules 217a, 217b, and 226 may include a first sensor module 217a disposed on the first surface 211 of the first housing 210, a second sensor module 217b disposed on the second surface 212 of the first housing 210, and/or a third sensor module 226 disposed on the fourth surface 222 of the second housing 220. In an embodiment, the sensor modules 217a, 217b, and 226 may include at least one of a gesture sensor, a grip sensor, a color sensor, an infrared (IR) sensor, an illuminance sensor, an ultrasonic sensor, an iris recognition sensor, or a distance detection sensor (e.g., a time of flight (TOF) sensor or a light detection and ranging (LiDAR)).

According to various embodiments, the electronic device 200 may further include an unillustrated sensor module, for example, at least one of an atmospheric sensor, a magnetic sensor, a biometric sensor, a temperature sensor, a humidity sensor, or a fingerprint recognition sensor. In an embodiment, the fingerprint recognition sensor may be disposed through at least one of the first side member 213 of the first housing 210 and/or the second side member 223 of the second housing 220.

According to various embodiments, the key input device 219 may be disposed to be exposed to the outside through the first side member 213 of the first housing 210. In an embodiment, the key input device 219 may be disposed to be exposed to the outside through the second side member 223 of the second housing 220. In an embodiment, the electronic device 200 may not include some or all of the key input device 219, and the unincluded key input device 219 may be implemented in another shape such as a soft key on the least one display 230 and 300. In an embodiment, the key input device 219 may be implemented using a pressure sensor included in the at least one display 230 and 300.

According to various embodiments, the connector port 229 may include a connector (e.g., a USB connector or an IF module (an interface connector port module)) for transmitting or receiving data and/or power to and/or from an external electronic device. In an embodiment, the connector port 229 may perform a function of transmitting or receiving an audio signal to or from the external electronic device together, or may further include a separate connector port (e.g., an ear jack hole) for performing a function of transmitting or receiving an audio signal to or from the external electronic device.

According to various embodiments, at least one camera modules 216a and 225 of the camera modules 216a, 216b, and 225, at least one sensor module 217a and 226 of the sensor modules 217a, 217b, and 226, and/or an indicator may be arranged to be exposed through the at least one display 230 and 300. For example, the at least one camera modules 216a and 225, the at least one sensor module 217a and 226, and/or the indicator may be arranged under an activated area (a display area) of the at least one display 230 and 300 in a space in the at least one housing 210 and 220, and may be arranged to come into contact with an external environment through a transparent area or an opening that is perforated to a cover member (e.g., a window layer (not shown) of the first display 230 and/or the second rear cover 250). According to an embodiment, an area in which the at least one display 230 and 300 and the at least one camera module 216a and 225 face each other may be formed as a transmission area having a predetermined transmission ratio, as a part of an area in which a content is displayed. According to an embodiment, the transmission area may be formed to have a transmission ratio in the range of about 5% to about 20%. The transmission area may include an area overlapping with an effective area (e.g., an angle of view area) of the at least one camera module 216a and 225, wherein an image is formed on the image sensor in the effective area, and light for generating an image passes through the effective area. For example, the transmission area of the display 230 and 300 may include an area in which the density of a pixel is lower than that in a surrounding area. For example, the transmission area may be replaced with an opening. For example, the at least one camera module 216a and 225 may include an under-display camera (UDC) or an under-panel camera (UPC). In an embodiment, some camera modules or sensor modules 271a and 226 may be arranged to perform functions thereof without being visually exposed through the display. For example, an area facing the sensor module 217a and 226 and/or the camera module 216a and 225 arranged under the display 230 and 300 (e.g., a display panel) corresponds to an under-display camera (UDC) structure, and a perforated opening is not necessarily required.

FIG. 3 is an exploded perspective view of an electronic device according to various embodiments.

With reference to FIG. 3, an electronic device 200 may include a first display 230 (e.g., a flexible display), a second display 300, at least one hinge device 400 and 400-1, a pair of support members 261 and 262, at least one board 270 (e.g., printed circuit board (PCB)), a first housing 210, a second housing 220, a first rear cover 240, and/or a second rear cover 250.

According to various embodiments, the first display 230 may include a display panel 430 (e.g., a flexible display panel), and a support plate 450 disposed under the display panel 430. In an embodiment, the first display 230 may include a reinforcement plate 462 disposed under the support plate 450. In a certain embodiment, the reinforcement plate 462 may be omitted. In an embodiment, the display panel 430 may include a first panel area 430a corresponding to a first area (e.g., the first area 230a of FIG. 1A) of the first display 230, a second panel area 430b extending from the first panel area 430a, and corresponding to a second area (e.g., the second area 230b of FIG. 1A) of the first display 230, and a third panel area 430c connecting the first panel area 430a and the second panel area 430b, and corresponding to a folding area (e.g., the folding area 230c of FIG. 1A) of the first display 230. In an embodiment, the support plate 450 may be disposed between the display panel 430 and a pair of support members 261 and 262, and may be formed to have a material and a shape for providing a flat type support structure for the first panel area 430a and the second panel area 430b and a bendable structure to help flexibility of the third panel area 430c. In an embodiment, the support plate 450 may be formed of a conductive material (e.g., metal) or a non-conductive material (e.g., polymer or fiber reinforced plastics (FRP). In an embodiment, the reinforcement plate 462 may include a first reinforcement plate 4621 disposed to correspond to at least a part of the first panel area 430a and the third panel area 430c and a second reinforcement plate 4622 disposed to correspond to at least a part of the second panel area 430b and the third panel area 430c between the support plate 450 and a pair of support members 261 and 262. In an embodiment, since the reinforcement plate 462 is formed of a metal material (e.g., SUS), it may help a ground connection structure and stiffness reinforcement for the first display 230. In a certain embodiment, the electronic device 200 may include a digitizer (e.g., the digitizer 461 of FIG. 4) which is disposed under the support plate 450, which is replaced by the reinforcement plate 462, or which is added between the support plate 450 and the reinforcement plate 462.

According to various embodiments, the second display 300 may be disposed in a space between the second housing 220 and the second rear cover 250. In an embodiment, the second display 300 may be disposed to be able to be viewed from an outside through substantially the whole area of the second rear cover 250 in the space between the second housing 220 and the second rear cover 250.

According to various embodiments, at least a part of the first support member 261 may be combined with the second support member 262 in a foldable manner through at least one hinge device 400 and 400-1. In an embodiment, the electronic device 200 may include at least one wiring member 263 (e.g., flexible printed circuit board (FPCB)) disposed from at least a part of the first support member 261 to a part of the second support member 262 across the at least one hinge device 400 and 400-1. In an embodiment, the first support member 261 may be disposed to extend from the first lateral member 213 or to be structurally combined with the first lateral member 213. In an embodiment, the electronic device 200 may include a first space (e.g., first space 2101 of FIG. 1A) provided through the first support member 261 and the first rear cover 240. In an embodiment, the first housing 210 (e.g., first housing structure) may be provided through a combination of the first lateral member 213, the first support member 261, and the first rear cover 240. In an embodiment, the second support member 262 may be disposed to extend from the second lateral member 223 or to be structurally combined with the second lateral member 223. In an embodiment, the electronic device 200 may include a second space (e.g., second space 2201 of FIG. 1A) provided through the second support member 262 and the second rear cover 250. In an embodiment, the second housing 220 (e.g., second housing structure) may be formed through a combination of the second lateral member 223, the second support member 262, and the second rear cover 250. In an embodiment, at least parts of the at least one wiring member 263 and/or the at least one hinge device 400 and 400-1 may be disposed to be supported through the at least one of the pair of support members 261 and 262. In an embodiment, the at least one wiring member 263 may be disposed to extend from the first support member 261 to the second support member 262 across the folding axis F. In an embodiment, the at least one wiring member 263 may be disposed to have a length in a direction (e.g., x-axis direction) substantially vertical to the folding axis (e.g., y axis or folding axis F of FIG. 1A).

According to various embodiments, at least one substrate 270 may include a first substrate 271 disposed in the first space 2101 and a second substrate 272 disposed in the second space 2201. In an embodiment, the first board 271 and the second substrate 272 may include a plurality of electronic components disposed to implement various functions of the electronic device 200. In an embodiment, the first substrate 271 and the second substrate 272 may be electrically connected through the at least one wiring member 263.

According to various embodiments, the electronic device 200 may include at least one battery 291 and 292. In an embodiment, the at least one battery 291 and 292 may include the first battery 291 disposed in the first space 2101 of the first housing 210 and electrically connected to the first substrate 271, and the second battery 292 disposed in the second space 2201 of the second housing 220 and electrically connected to the second substrate 272. In an embodiment, the first support member 261 and the second support member 262 may further include at least one swelling hole for the first battery 291 and the second battery 292.

According to various embodiments, the first housing 210 may include a first rotation support surface 214, and the second housing 220 may include a second rotation support surface 224 corresponding to the first rotation support surface 214. In an embodiment, the first rotation support surface 214 and the second rotation support surface 224 may include a curved surface corresponding (naturally connected) to a curved outer surface of a hinge housing 310. In an embodiment, the first rotation support surface 214 and the second rotation support surface 224 hide the hinge housing 310 in case the electronic device 200 is in an unfolding state, and thus the hinge housing 310 may not be exposed to the rear surface of the electronic device, or only a part thereof may be exposed. In an embodiment, in case the electronic device 200 is in a folding state, the first rotation support surface 214 and the second rotation support surface 224 may be rotated along the curved outer surface of the hinge housing 310 to expose at least a part of the hinge housing 310 to the rear surface of the electronic device 200.

According to various embodiments, the electronic device 200 may include at least one antenna 276 disposed in the first space 2201. In an embodiment, the at least one antenna 276 may be disposed on the first battery 291 and the first rear cover 240 in the first space 2201. In an embodiment, the at least one antenna 276 may include, for example, a near field communication (NFC) antenna, a wireless charging antenna, and/or a magnetic secure transmission (MST) antenna. In an embodiment, the at least one antenna 276, for example, may perform short range communication with an external device, or may wirelessly transmit and receive a power required for charging. In a certain embodiment, an antenna structure may be formed by at least a part of the first lateral member 213 or the second lateral member 223 and/or parts of the first support member 261 and the second support member 262 or a combination thereof.

According to various embodiments, the electronic device 200 may further include at least one electronic component assembly 274 and 275 and/or additional support members 263 and 273 disposed in the first space (e.g., first space 2101 of FIG. 1A) and/or the second space (e.g., second space 2201 of FIG. 1A). For example, the at least one electronic component assembly may include an interface connector port assembly 274 or a speaker assembly 275.

According to various embodiments, the electronic device 200 may include a first waterproof member WP1 disposed between the first reinforcement plate 4621 and the first support member 261 and a second waterproof member WP2 disposed between the second reinforcement plate 4622 and the second support member 262. In an embodiment, the first waterproof member WP1 may provide at least one first waterproof space between the first reinforcement plate 4621 and the first support member 261. In an embodiment, the at least one first waterproof space may accommodate an area corresponding to at least one electronic component (e.g., camera module or sensor module) disposed to be supported by the first support member 261. In an embodiment, the second waterproof member WP2 may provide a second waterproof space between the second reinforcement plate 4622 and the second support member 262. In an embodiment, the second waterproof space may accommodate at least a part of a bending part that is folded over the rear surface of the first display 230. For example, the second waterproof space may be disposed to extend from the display panel 430 of the first display 230 and to surround at least a part of the bending part (e.g., bending part 432 of FIG. 4) that is folded over the rear surface. Accordingly, a control circuit (e.g., control circuit 4321a (e.g., display driver IC (DDI) of FIG. 4) and a plurality of electrical elements (e.g., electrical elements 4322a of FIG. 5B) disposed on the bending part 432 may be disposed in the second waterproof space, and thus can be protected from external moisture and/or foreign substances.

According to various embodiments, the electronic device 200 may include a waterproof tape 241 disposed between the first rear cover 240 and the first housing 210. In an embodiment, the electronic device 200 may include a bonding member 251 disposed between the second rear cover 250 and the second housing 220. In a certain embodiment, the bonding member 251 may also be disposed between the second display 300 and the second housing 220. In a certain embodiment, the waterproof tape 241 may be replaced by the bonding member 251, and the bonding member 251 may be replaced by the waterproof tape 241.

According to various embodiments, the at least one hinge device 400 and 400-1 may include the first hinge device 400 disposed at one end and the second hinge device 400-1 disposed at the other end in a direction parallel to the folding axis F. In an embodiment, the first hinge device 400 and the second hinge device 400-1 may have substantially the same construction. In an embodiment, the electronic device 200 may include a connection module 400-2 disposed between the first hinge device 400 and the second hinge device 400-1. In an embodiment, the connection module 400-2 may be disposed through a combination of at least one gear and/or a combination of at least one link. In a certain embodiment, the connection module 400-2 may be replaced by the first hinge device 400. In a certain embodiment, the at least one hinge device 400 and 400-1 may be disposed in one place or in three or more places at designated intervals along the direction parallel to the folding axis F. In an embodiment, the electronic device 200 may include a first hinge plate 311 and a second hinge plate 312 connected through the at least one hinge device 400 and 400-1. In an embodiment, the first hinge plate 311 may form the same plane as that of the first housing 210 in the unfolding state, and the second hinge plate 312 may form the same plane as that of the second housing 220 in the unfolding state.

Figure 4:
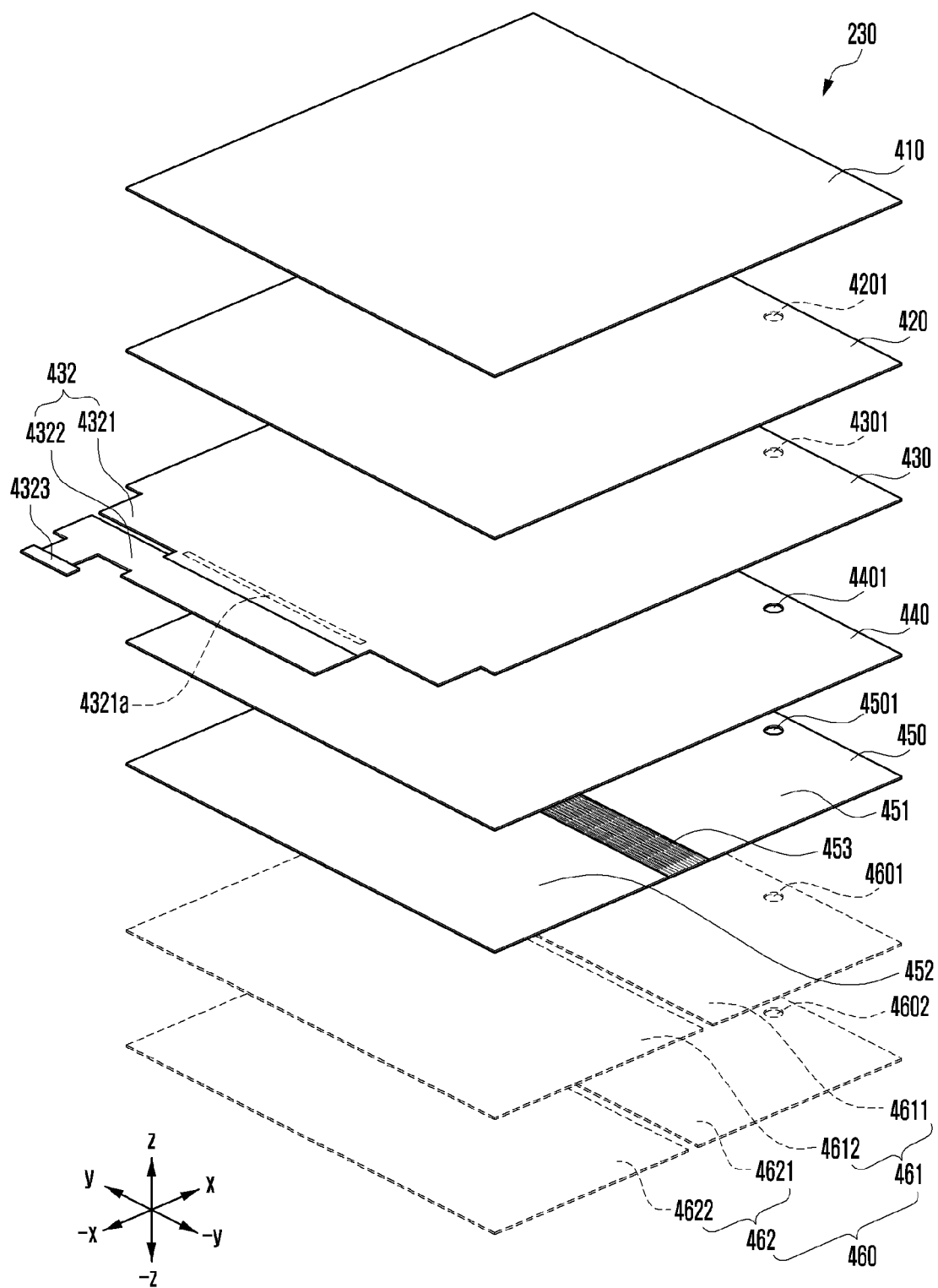
FIG. 4 is an exploded perspective view of a flexible display according to various embodiments.

FIG. 4 is an exploded perspective view of a flexible display according to various embodiments.

The flexible display 230 of FIG. 4 may be similar to the first display 230 of FIG. 1A at least partly, or may further include other embodiments of the flexible display.

The flexible display 230 according to various example embodiments of the disclosure may include an unbreakable (UB) type OLED display (e.g., curved display). However, the flexible display 230 is not limited thereto, and may include a flat type display of an on cell touch active matrix organic light-emitting diode (AMOLED) (OCTA) type.

With reference to FIG. 4, the first display 230 (hereinafter, referred to as a "flexible display") may include a protection layer 410 (e.g., window layer), a polarization layer (polarizer (POL)) 420 (e.g., polarization film) sequentially disposed on the rear surface (e.g., −z-axis direction) of the protection layer 410, a display panel 430, a polymer layer 440, a support plate 450, and a functional layer 460. In an embodiment, the functional layer 460 may include a digitizer 461 and/or a reinforcement plate 462. In an embodiment, the reinforcement plate 462 may include a first reinforcement plate 4621 disposed at a location corresponding to the first housing (e.g., first housing 210 of FIG. 1A) and a second reinforcement plate 4622 disposed at a location corresponding to the second housing (e.g., second housing 220 of FIG. 1A). In a certain embodiment, the reinforcement plate 462 may be integrally formed. In a certain embodiment, the flexible display 230 may include the digitizer 461 disposed between the support plate 450 and the reinforcement plate 462. In a certain embodiment, the digitizer 461 may include a first digitizer 4611 disposed at a location corresponding to the first housing (e.g., first housing 210 of FIG. 1A) and a second digitizer 4612 disposed at a location corresponding to the second housing (e.g., second housing 220 of FIG. 1A). In a certain embodiment, the digitizer 461 may be integrally formed. In a certain embodiment, the digitizer 461 may include coil members disposed on a dielectric board (e.g., dielectric film or dielectric sheet) so that they can detect an electromagnetic induction type resonance frequency applied from an electronic pen. In a certain embodiment, in case the flexible display 230 is a POL-less display, the polarization layer may be omitted, and a transparent reinforcement layer (e.g., buffer layer) may be further disposed at that location. In a certain embodiment, the polymer layer 440 and/or the reinforcement plate 462 may be omitted. In a certain embodiment, the polymer layer 440 may be disposed on the reinforcement plate 462.

According to various embodiments, the protection layer 410 may include a first layer (e.g., first layer 411 of FIG. 6), a second layer (e.g., second layer 412 of FIG. 6), and a third layer (e.g., third layer 413 of FIG. 6) which are sequentially laminated on the display panel 430. In an embodiment, the first layer 411 may be formed of glass. In an embodiment, the second layer 412 and the third layer 413 may be formed of polymer (e.g., polyethylene terephthalate (PET), polyimide (PI), or thermoplastic polyurethane (TPU)). In a certain embodiment, three or more layers (e.g., second layer 412 and third layer 413) formed of polymer may be formed within a range of a standard thickness that is permitted as the protection layer 410 of the flexible display 230. In an embodiment, the third layer 413 may include a coating layer (e.g., coating layer 414 of FIG. 6) coated on the upper surface. In an embodiment, the coating layer 414 may include at least one of a hard coating (HC) layer, an anti-reflection (AF)/low-reflection (LR) coating layer, a shatterproof (SP) coating layer, or an anti-fingerprint (AF) coating layer. In a certain embodiment, the coating layer may be formed between the second layer 412 and the third layer 413. In an embodiment, the first layer 411, the second layer 412, and the third layer 413 may be disposed in a manner that they are laminated on one another through an adhesive. For example, the adhesive may include at least one of an optical clear adhesive (OCA), a pressure sensitive adhesive (PSA), a thermal reaction adhesive, a general adhesive, or a double-sided tape.

According to various embodiments, the protection layer 410, the polarization layer 420, the display panel 430, the polymer layer 440, and the support plate 450 may be disposed to cross at least parts of the first surface (e.g., first surface 211 of FIG. 1A) of the first housing (e.g., first housing 210 of FIG. 1A) and the third surface (e.g., third surface 221 of FIG. 1A) of the second housing (e.g., second housing 220 of FIG. 1A). In an embodiment, the reinforcement plate 462 may provide stiffness for the flexible display 230, and may be used as a ground for preventing and/or reducing malfunction of the flexible display 230. In an embodiment, the reinforcement plate 462 may be formed of a metal material. In an embodiment, the reinforcement plate 462 may be formed of SUS or Al. In an embodiment, the protection layer 410, the polarization layer 420, the display panel 430, the polymer layer 440, the support plate 450, and the reinforcement plate 462 may also be attached to one another through the adhesive (or adhesive member).

According to various embodiments, the display panel 430 may include a plurality of pixels and a wiring structure (e.g., electrode pattern). In an embodiment, the polarization layer 420 may selectively pass light which is generated from a light source of the display panel 430 and vibrates in a constant direction. In an embodiment, the display panel 430 and the polarization layer 420 may be integrally formed. In an embodiment, the polarization layer 420 may be deleted by disposing a color filter formed of red (R), green (G), and blue (B) pigments having a polarization function on the pixels disposed on the display panel 430. In an embodiment, in case of applying the color filter having the polarization function, a light reflection blocking layer (e.g., black pixel define layer (BPDL)) that can prevent and/or reduce the reflection of an external light may be included inside the display panel 430. In an embodiment, the flexible display 230 may also include a touch panel (not illustrated).

According to various embodiments, since the polymer layer 440 is disposed under the display panel 430, it may provide a dark background for securing visibility of the display panel 430, and may be formed of a buffer material for a buffering action. In a certain embodiment, for waterproofing of the flexible display 230, the polymer layer 440 may be deleted, or may be disposed under the support plate 450. In a certain embodiment, the polymer layer 440 may be omitted in case the support plate 450 is formed of an opaque material.

According to various embodiments, the support plate 450 may provide the flexural characteristic to the flexible display 230. For example, the support plate 450 may be formed of a non-metal thin plate material, such as fiber reinforced plastics (FRP) (e.g., carbon fiber reinforced plastics (CFRP) or glass fiber reinforced plastics (GFRP)), having the rigid characteristic for supporting the display panel 430. In an embodiment, the support plate 450 may include a first plane part 451 corresponding to the first housing (e.g., first housing 110 of FIG. 1A), a second plane part 452 corresponding to the second housing (e.g., second housing 120 of FIG. 1A), and a flexible part 453 (flexible portion or bending portion) connecting the first plane part 451 and the second plane part 452. In an embodiment, in order to improve the flexibility, the flexible part 453 may include a plurality of openings formed to penetrate from the upper surface to the rear surface of the support plate 450 and/or a plurality of recesses formed on a part of the upper surface and/or a part of the rear surface. In an embodiment, the flexibility characteristic of the flexible part 453 may be determined through at least one of the size, shape, or disposition density of at least some of the plurality of openings and/or at least some of the plurality of recesses. In a certain embodiment, the support plate 450 may be formed of a metal material, such as steel use stainless (SUS) (e.g., stainless steel (STS), Cu, Al, or CLAD (e.g., laminated member in which SUS and Al are alternately disposed). In this case, the plurality of openings may be formed over the whole area so that the detection operation of the digitizer 461 disposed under the support plate 450 is induced. In an embodiment, the support plate 450 may help the stiffness reinforcement of the electronic device (e.g., electronic device 100 of FIG. 1A), shield surrounding noises, and be used to disperse heat emitted from surrounding heat emission components.

According to various embodiments, the flexible display 230 may include at least one sub-material layer (not illustrated) disposed between the polymer layer 440 and the support plate 450 or under the support plate 450. In an embodiment, the at least one sub-material layer may include a graphite sheet for heat dissipation, a force touch FPCB, a fingerprint sensor FPCB, an antenna radiator for communication, or a conductive/non-conductive tape. In an embodiment, the at least one sub-material layer may be replaced by the functional layer 460 including the above-described digitizer 461 and/or the reinforcement plate 462. In an embodiment, in case the at least one sub-material layer is unable to be bent, it may be individually disposed on the first housing (e.g., first housing 110 of FIG. 1A) and the second housing (e.g., second housing 120 of FIG. 1A). In an embodiment, in case the at least one sub-material layer is able to be bent, it may be integrally formed so as to be disposed from the first housing (e.g., first housing 110 of FIG. 1A) to at least a part of the second housing (e.g., second housing 120 of FIG. 1A) through the hinge device (e.g., hinge device 140 of FIG. 3).

According to various embodiments, the flexible display 230 may include a bending part 432 disposed so as to be folded from the display panel 430 to at least a partial area of the rear surface (e.g., −z-axis direction) of the flexible display 230. In an embodiment, the bending part 432 may include an extension part 4321 extending from the display panel 430 and including a control circuit 4321a and a flexible printed circuit board (FPCB) 4322 electrically connected to the extension part 4321 and including a plurality of electronic elements. In an embodiment, the control circuit 4321a may include a display driver IC (DDI) or a touch display driver IC (TDDI) mounted on the extension part 4321 having an electrical wiring structure. In an embodiment, the bending part 432 may include a chip on panel or chip on plastic (COP) structure in which the control circuit 4321a is directly disposed on the extension part 4321. In a certain embodiment, the bending part 432 may include a chip on film (COF) structure in which the control circuit 4321a is mounted on a separate connection film (not illustrated) that connects the extension part 4321 and the flexible board 4322 with each other. In an embodiment, the flexible display 230 may include a plurality of electronic elements (e.g., electronic elements 4322a of FIG. 5B) disposed on the flexible board 4322. In an embodiment, the plurality of electronic elements may include a touch IC, a flash memory for display, a diode for preventing and/or reducing ESD, a pressure sensor, a fingerprint sensor, or a passive element such as a decap. In an embodiment, the flexible display 230 may include an FPCB connection part 4323 (e.g., connector part) extending from the flexible board 4322 and electrically connected to the board (e.g., second board 272 of FIG. 3) of the electronic device (e.g., electronic device 200 of FIG. 3). As an embodiment, in case the bending part 432 is disposed on the area of the flexible display 230 that faces the first housing (e.g., first housing 110 of FIG. 1A), the FPCB connection part 4323 may be electrically connected to another board (e.g., first board 271 of FIG. 3) of the electronic device (e.g., electronic device 200 of FIG. 3).

According to various embodiments, the flexible display 230 may include openings 4201, 4301, 4401, 4501, 4601, and 4602 disposed on the respective layers 420, 430, 440, 450, and 460 and perforated on the area corresponding to the electronic component (e.g., camera device) disposed on the lower side thereof. In a certain embodiment, the display panel 430 and/or the polarization layer 420 may not require the perforated openings.

The flexible display 230 according to various example embodiments of the disclosure may include the protection layer 410 divided into the plurality of layers (e.g., the first layer 411, the second layer 412, and the third layer 413) laminated on one another through the adhesive within the designated thickness range. For example, since the protection layer 410 divided into the plurality of layers (e.g., the first layer 411, the second layer 412, and the third layer 413) may help the folding area transformed by the frequent folding operation of the electronic device 200 to be restored from the unfolding state to the original state, it may help the improvement of the crease occurring around the folding area, and the improvement of reliability of the electronic device through reduction of the delamination between the protection layer 410 and the display panel 430.

Figure 5A:
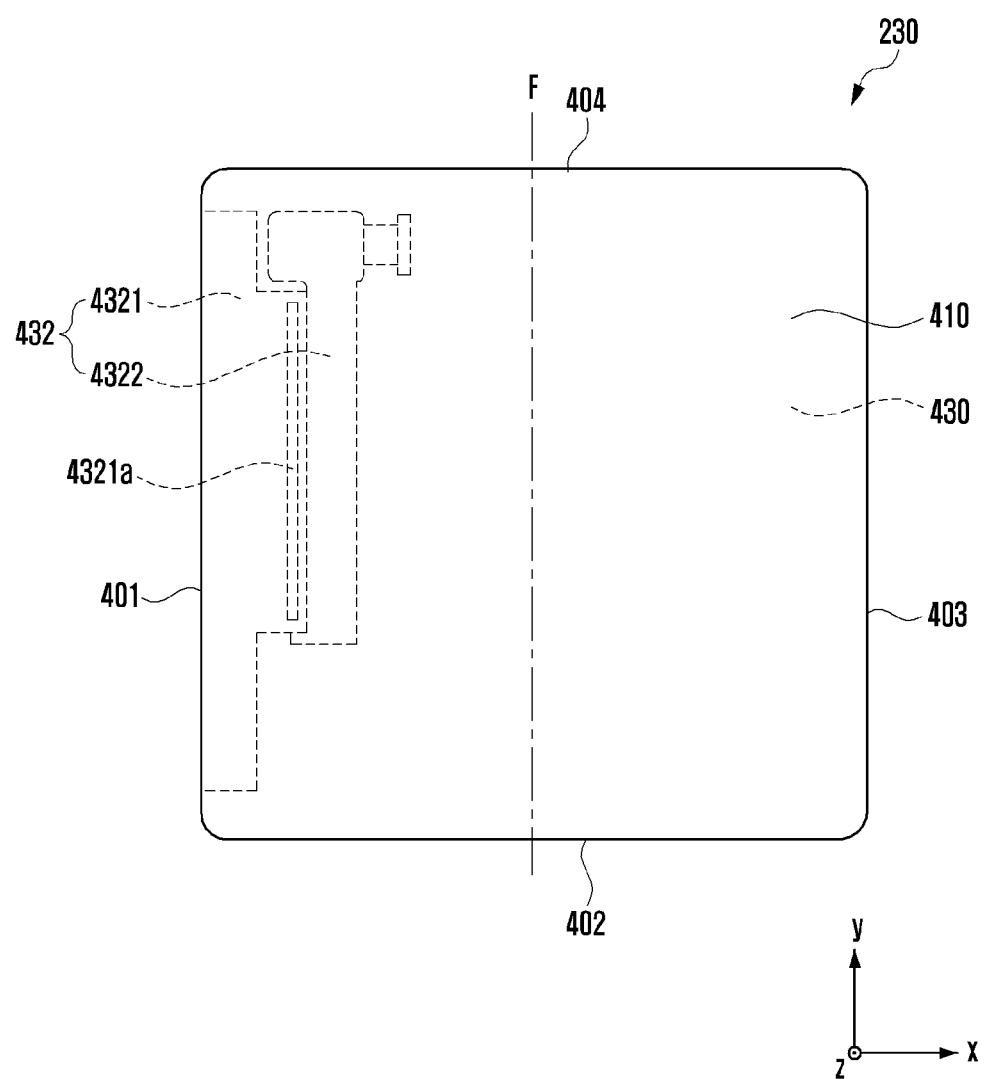
FIG. 5A is a diagram illustrating a flexible display according to various embodiments.
Figure 5B:
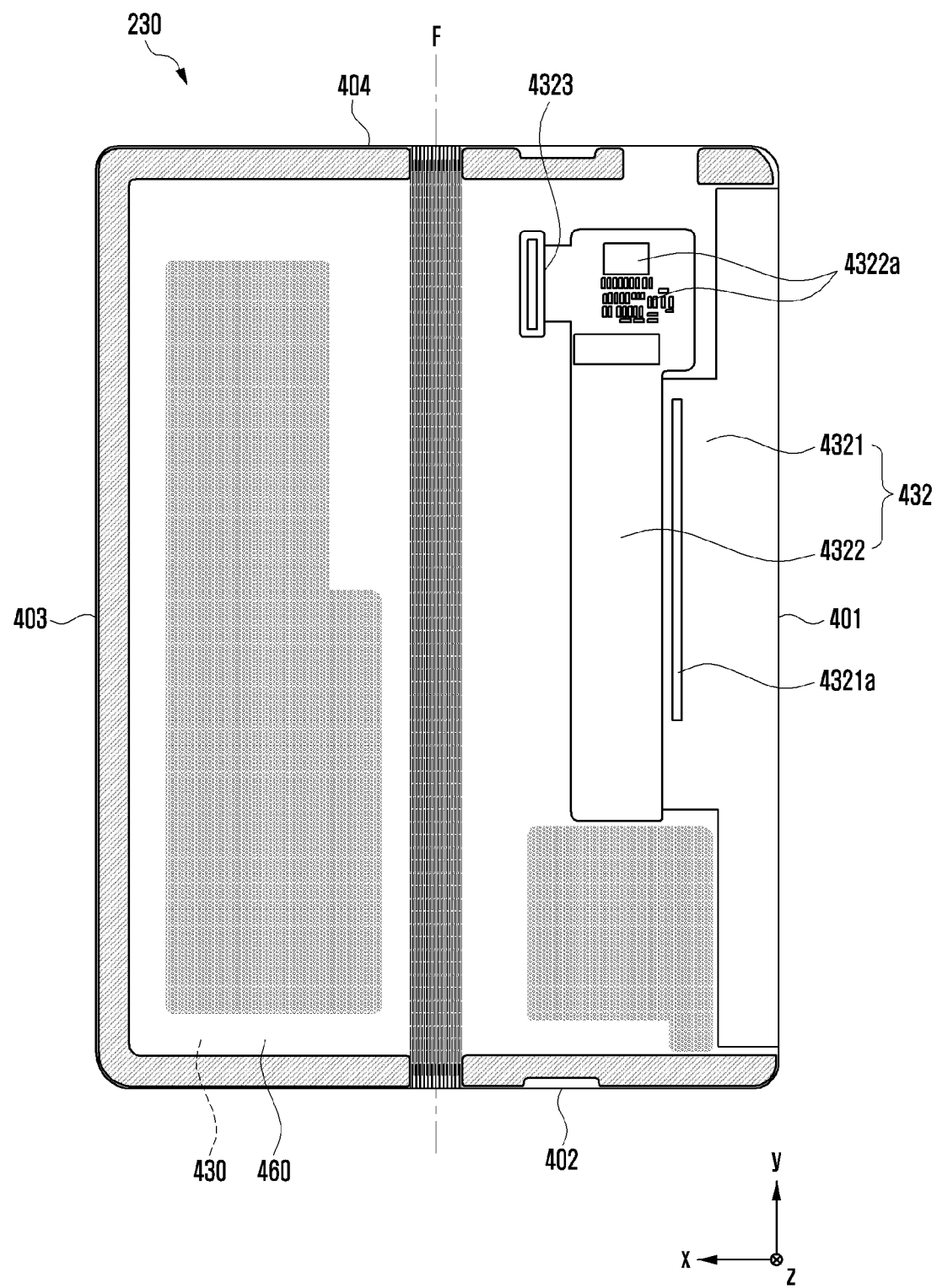
FIG. 5B is a diagram illustrating a rear view of a flexible display according to various embodiments.

FIG. 5A is a diagram illustrating a front view of a flexible display according to various embodiments. FIG. 5B is a diagram illustrating a rear view of a flexible display according to various embodiments.

The flexible display 230 of FIGS. 5A and 5B may be substantially similar to the first display 230 of FIG. 1A, or may further include other embodiments of the flexible display.

With reference to FIGS. 5A and 5B, the flexible display 230 may include: a first edge 401 having a first length; a second edge 402 extending in a vertical direction (e.g., x-axis direction) from the first edge 401, and having a second length; a third edge 403 extending in a direction parallel to the first edge 401 from the second edge 402, and having the first length; and a fourth edge 404 404 extending in a direction parallel to the second edge 402 from the third edge 403 to the first edge 401. In an embodiment, the first edge 401 may be formed to have the length in the direction parallel to the folding axis F. In an embodiment, the first length may be formed to be longer than the second length. In a certain embodiment, the first length may be formed to be equal to the second length or to be shorter than the second length.

According to various embodiments, the flexible display 230 may include the display panel 430 and the protection layer 410 laminated on the upper surface of the display panel 430. In an embodiment, the flexible display 230 may include the bending part 432 attached to the rear surface of the flexible display 230 in a manner that the bending part 432 extends and is bent from the display panel 430 at the first edge 401. In an embodiment, the bending part 432 may include an extension part 4321, a flexible printed circuit board 4322 extending from the extending part 4321, and an FPCB connection part 4323 extending from at least a part of the flexible printed circuit board 4322. In an embodiment, the flexible display 230 may include a control circuit 4321a disposed on the extension part 4321 and a plurality of electronic elements 4322a disposed on the flexible printed circuit board 4322. In a certain embodiment, the bending part 432 may be disposed to extend from any one of the second edge 402, the third edge 403, or the fourth edge 404, rather than the first edge 401.

Figure 6:
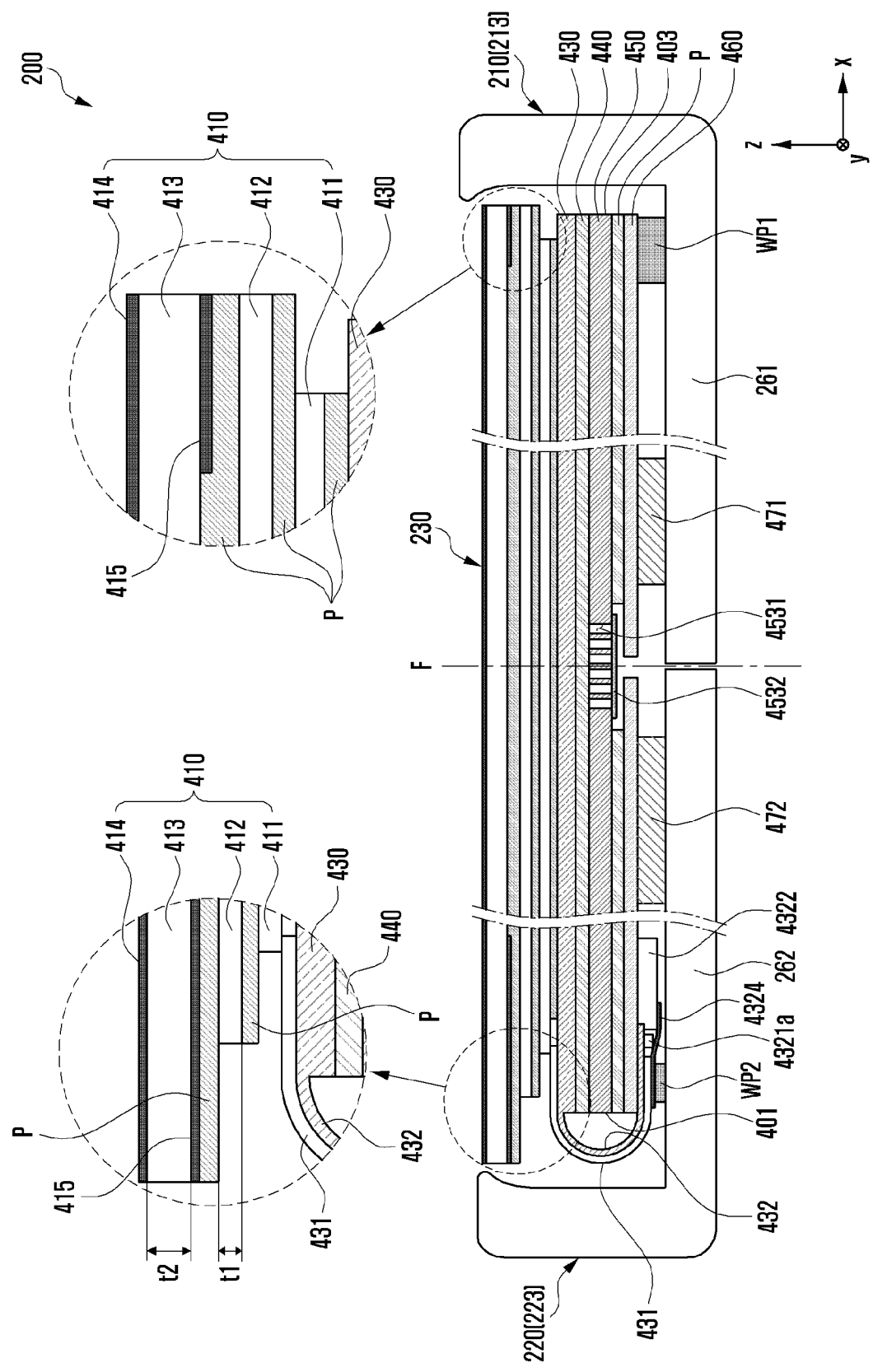
FIG. 6 is a cross-sectional view of an electronic device taken along line 6-6 of FIG. 1A according to various embodiments.

According to an example embodiment of the disclosure, since the protection layer 410 includes the plurality of layers (e.g., the first layer 411, second layer 412, and third layer 413 of FIG. 6) laminated through the adhesive within the designated thickness of the protection layer, it is possible to improve the degree of restoration of the area transformed according to the folding operation from the unfolding state to the original state through the structure in which the plurality of thin layers are laminated, rather than one layer, within the designated thickness of the protection layer, and through this, it is possible to help the crease improvement and surface quality improvement of the flexible display 230.

FIG. 6 is a cross-sectional view of an electronic device taken along line 6-6 of FIG. 1A according to various embodiments.

With reference to FIG. 6, the electronic device 200 may include the first housing 210 including the first lateral member 213, the second housing 220 including the second lateral member 223 and connected in a foldable manner with the first housing 210 through the hinge devices 400 and 400-1 (refer to FIG. 3), and the flexible display 230 disposed to be supported by the first housing 210 and the second housing 220.

According to various embodiments, the flexible display 230 may include the protection layer 410, and the display panel 430, the polymer layer 440, and the support plate 450 sequentially disposed under the protection layer 410. In an embodiment, the support plate 450 may include a pattern 4531 including a plurality of openings formed at designated intervals in the folding area (e.g., folding area 230c of FIG. 1A) to provide flexibility to the flexible display 230. In a certain embodiment, the pattern 4531 may be replaced by a plurality of recesses formed to be lower than the outer surface thereof. In a certain embodiment, the pattern 4531 may be in the form in which the plurality of openings and the plurality of recesses are used interchangeably. In an embodiment, the flexible display 230 may include a blocking member 4532 disposed in the area corresponding to the folding area 230c under the support plate 450, and disposed to block the plurality of openings of the pattern 4531. According to an embodiment, the blocking member 4532 may include thermoplastic polyurethane (TPU) attached to the support plate 450. In an embodiment, the electronic device 200 may include the functional layer 460 disposed under the flexible display 230. In this case, the functional layer 460 may be attached to the support plate 450 at least partly through the adhesive P. In an embodiment, the functional layer 460 may include the digitizer (e.g., the digitizer 461 of FIG. 4) and/or the reinforcement plate (e.g., the reinforcement plate 462 of FIG. 4).

According to various embodiments, the electronic device 200 may include at least one adhesive member 471 and 472 disposed between the flexible display 230 and the housings 210 and 220. For example, the at least one adhesive member 471 and 472 may include the first adhesive member 471 disposed between the functional layer 460 and the first housing 210, and the second adhesive member 472 disposed between the functional layer 460 and the second housing 220. In an embodiment, the electronic device 200 may further include the graphite for heat dissipation, the buffer member (e.g., sponge) for buffering, an offset compensation member for offset compensation, and/or the waterproof member for waterproofing, being disposed in at least a partial area, other than the area in which the first adhesive member 471 and the second adhesive member 472 are disposed, between the functional layer 460 and the first housing 210 and/or between the functional layer 460 and the second housing 220.

According to various embodiments, the flexible display 230 may include the bending part 431 attached to the rear surface of the flexible display 230 in a manner that the flexible display 230 extends and is bent from the display panel 430 at the first edge 401. In an embodiment, the bending part 432 may include the extension part 4321 and the flexible printed circuit board 4322 extending from the extension part 4321. In an embodiment, the flexible display 230 may include the control circuit 4321a disposed on the extension part 432. In an embodiment, since the control circuit 4321a is disposed in a confined space formed by a cover tape 4324 attached to connect the bending part 432 and the flexible printed circuit board 4322, it can be protected from external moisture and/or foreign substances. In an embodiment, the bending part 432 may further include the bending part protection layer 431 being laminated on the outer surface to protect the bending part 432.

According to various embodiments, the protection layer 410 may include the first layer 411, the second layer 412, and the third layer 413 which are sequentially laminated on the display panel 430. In an embodiment, the first layer 411 may be formed of glass. In an embodiment, the second layer 412 and the third layer 413 may be formed of polymer (e.g., polyethylene terephthalate (PET), polyimide (PI), or thermoplastic polyurethane (TPU)). In a certain embodiment, the three or more layers 412 and 413 formed of polymer may be formed within the range of the standard thickness that is permitted as the protection layer 410 of the flexible display 230. In an embodiment, the first layer 411, the second layer 412, and the third layer 413 may be disposed to be laminated on one another through the adhesive P. For example, the adhesive P may include at least one of an optical clear adhesive (OCA), a pressure sensitive adhesive (PSA), a thermal reaction adhesive, a general adhesive, or a double-sided tape.

According to an example embodiment of the disclosure, since the polymer layers (e.g., the second layer 412 and the third layer 413) formed in a multilayer laminated structure are formed with a thickness that is thinner than the thickness of the polymer layer in the comparative example that is formed of one layer within the same thickness range of the protection layer 410, it is possible to improve the degree of restoration of the transformed area in the folding state to the original state when the transformed area in the folding state is switched over to the unfolding state (e.g., the burnout deformation can be reduced), and through this, it is possible to help the crease improvement and the surface quality improvement of the flexible display 230. In an embodiment, the protection layer 410 may include the coating layer 414 laminated on the outer surface of the third layer 413. In an embodiment, the coating layer 414 may be formed to improve visibility of the flexible display 230, to improve durability, and to prevent and/or reduce the user's fingerprint. For example, the coating layer 414 may include at least one of a hard coating (HC) layer, an anti-reflection (AR)/low-reflection (LR) coating layer, a shatterproof (SP) coating layer, or an anti-fingerprint (AF) coating layer. In an embodiment, the flexible display 230 may include a print layer 415 (e.g., black print layer) formed under the third layer 413 to prevent and/or reduce the first edge 401 from being visually recognized from outside. In an embodiment, the print layer 415 may be disposed to have a width overlapping at least the first edge 401 and the bending part 432, when the flexible display 230 is viewed from above, on the rear surface of the third layer 413. In an embodiment, the print layer 415 may be disposed to have a width overlapping at least the second edge 402, the third edge 403, and the fourth edge (e.g., the fourth edge 404 of FIG. 5A), when the flexible display 230 is viewed from above, on the rear surface of the third layer 413.

According to various embodiments, through the forming of the coating layer 414, the third layer 413 may be formed with a thickness t2 that is thicker than the thickness t1 of the second layer 412. In an embodiment, the thickness t2 of the third layer 413 may be determined not to exceed 80 μm. In an embodiment, the thickness t1 of the second layer 412 may be determined to exceed 20 μm. In an embodiment, the thickness t1 of the second layer 412 may be equal to the thickness t2 of the third layer 413. For example, in the comparative example, the thickness of one protection layer formed of polymer is 115 μm, whereas in an example embodiment of the disclosure, the protection layer 410 is formed of polymer, and the thicknesses of the second layer 412 and the third layer 413 corresponding to the protection layer in the comparative example are set to 25 μm and 55 μm, respectively, excluding the thickness of the adhesive layer (35 μm), in the same conditions, so that it is possible to provide the polymer layers which are relatively thin as compared with the comparative example, and which have an improved restoring force (e.g., reduced burnout deformation). Accordingly, the polymers of the protection layer, which have the same overall thickness and the improved restoring force, can help the crease improvement and the surface quality improvement of the flexible display 230.

According to various embodiments, in order to protect the bending part 432, at the first edge 401 of the flexible display 230, the third layer 413 may be formed to extend in the direction of the second lateral member 223 (e.g., x-axis direction) than the second layer 412 so as to overlap at least the bending part 432, when the flexible display 230 is viewed from above. In an embodiment, the third layer 413 may be formed so that the end part thereof coincides with that of the second layer 412, in order to slim the electronic device 200, at the second edge (e.g., second edge 402 of FIG. 5A), the third edge 403, and the fourth edge (e.g., the fourth edge 404 of FIG. 5A).

FIGS. 7A, 7B, 7C, 7D and 7E are cross-sectional views of an electronic device according to various embodiments.

In describing the electronic device 200 in FIGS. 7A, 7B, 7C, 7D and 7E, the same reference numerals are used for the elements substantially the same as those of the electronic device 200 of FIG. 6, and the detailed explanation thereof may not be repeated.

Figure 7A:
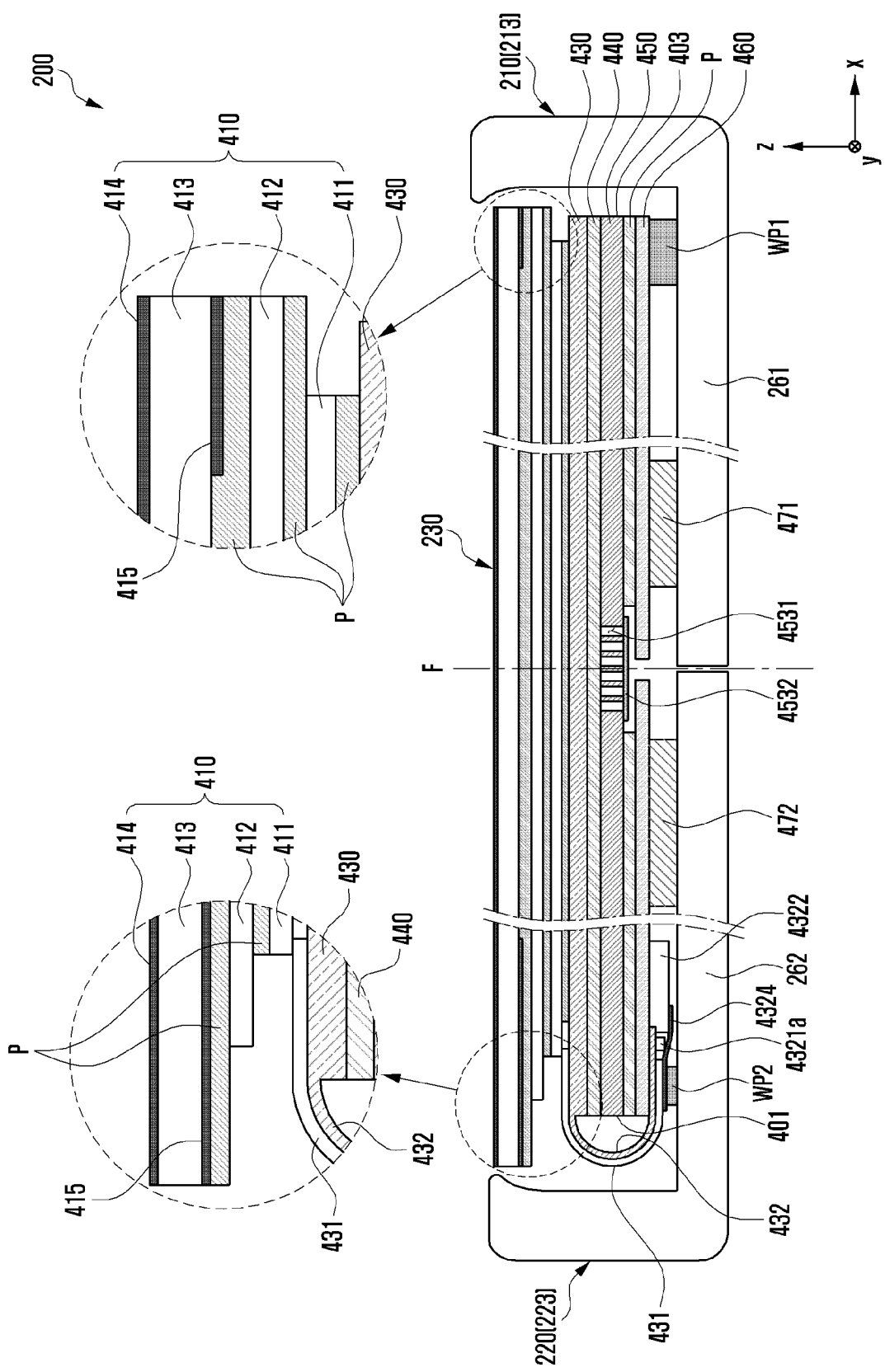
FIGS. 7A, 7B, 7C, 7D and 7E are cross-sectional views of an electronic device according to various embodiments.

With reference to FIG. 7A, the flexible display 230 may include the first layer 411 (e.g., the glass layer) laminated on the display panel 430, the second layer 412 (e.g., polymer layer) laminated on the first layer 411, and the third layer 413 (e.g., polymer layer) laminated on the second layer 412 through the adhesive P. In an embodiment, the first layer 411 may be formed to be smaller than the second layer 412 at the first edge 401. In this case, since the adhesive P attaching the first layer 411 and the second layer 412 to each other is formed to coincide with the end part of the first layer 411, it is possible to help the improvement of the interference phenomenon between the bending part 432 and the second layer 412 during the folding operation of the flexible display 230.

Figure 7B:
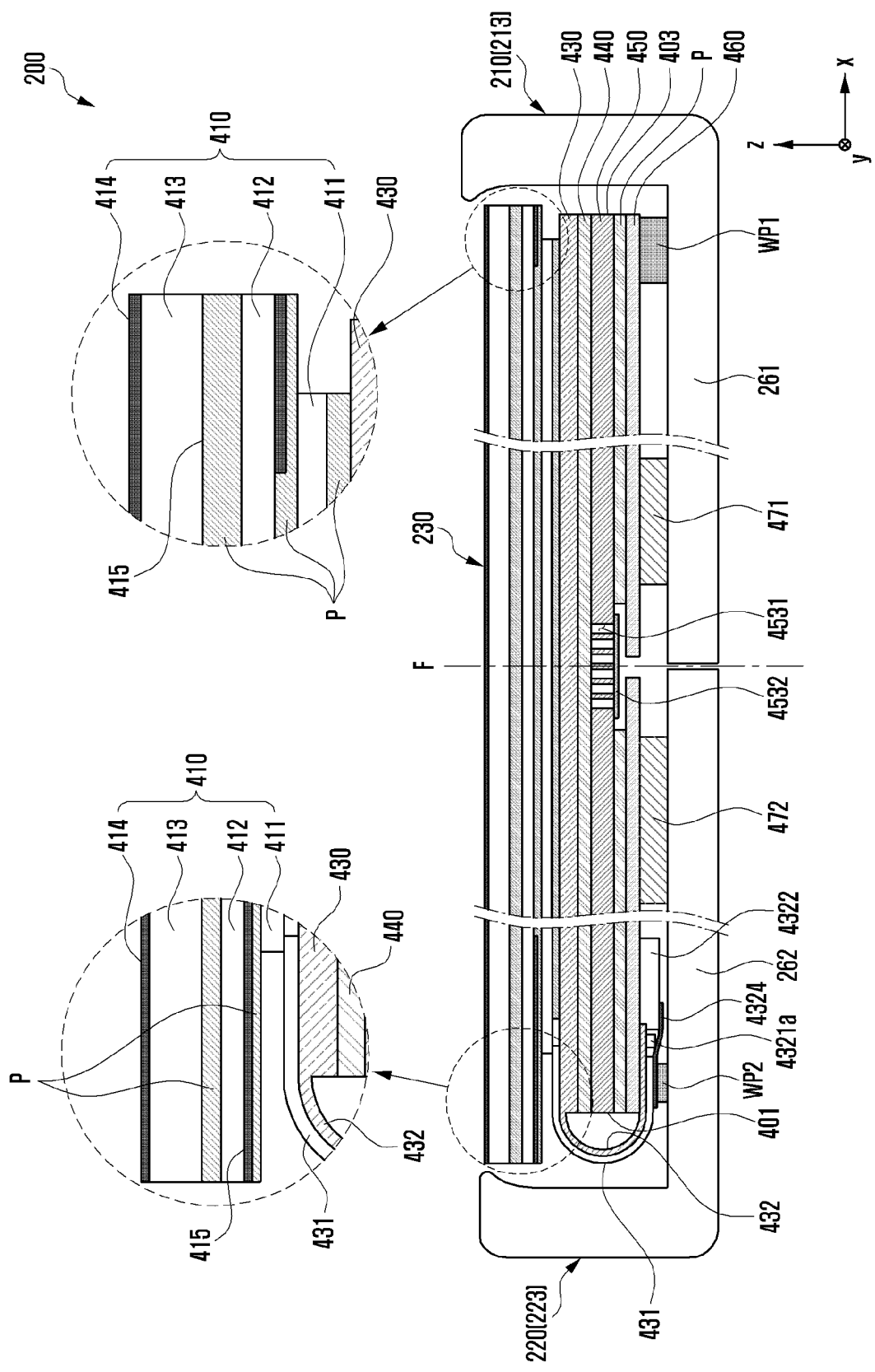

With reference to FIG. 7B, the flexible display 230 may include the first layer 411 (e.g., the glass layer) laminated on the display panel 430, the second layer 412 (e.g., polymer layer) laminated on the first layer 411, and the third layer 413 (e.g., polymer layer) laminated on the second layer 412 through the adhesive P. In an embodiment, the second layer 412 and the third layer 413 may be formed with a size overlapping at least the bending part 432, when the flexible display 230 is viewed from above, at the first edge 401. In an embodiment, the second layer 412 and the third layer 413 may be formed so that their end parts coincide with each other. In this case, since the print layer 415 is disposed on the rear surface of the second layer 412 so as to be closer to the bending part 432, it is possible to help the visibility improvement of the first edge 401 from the outside.

Figure 7C:
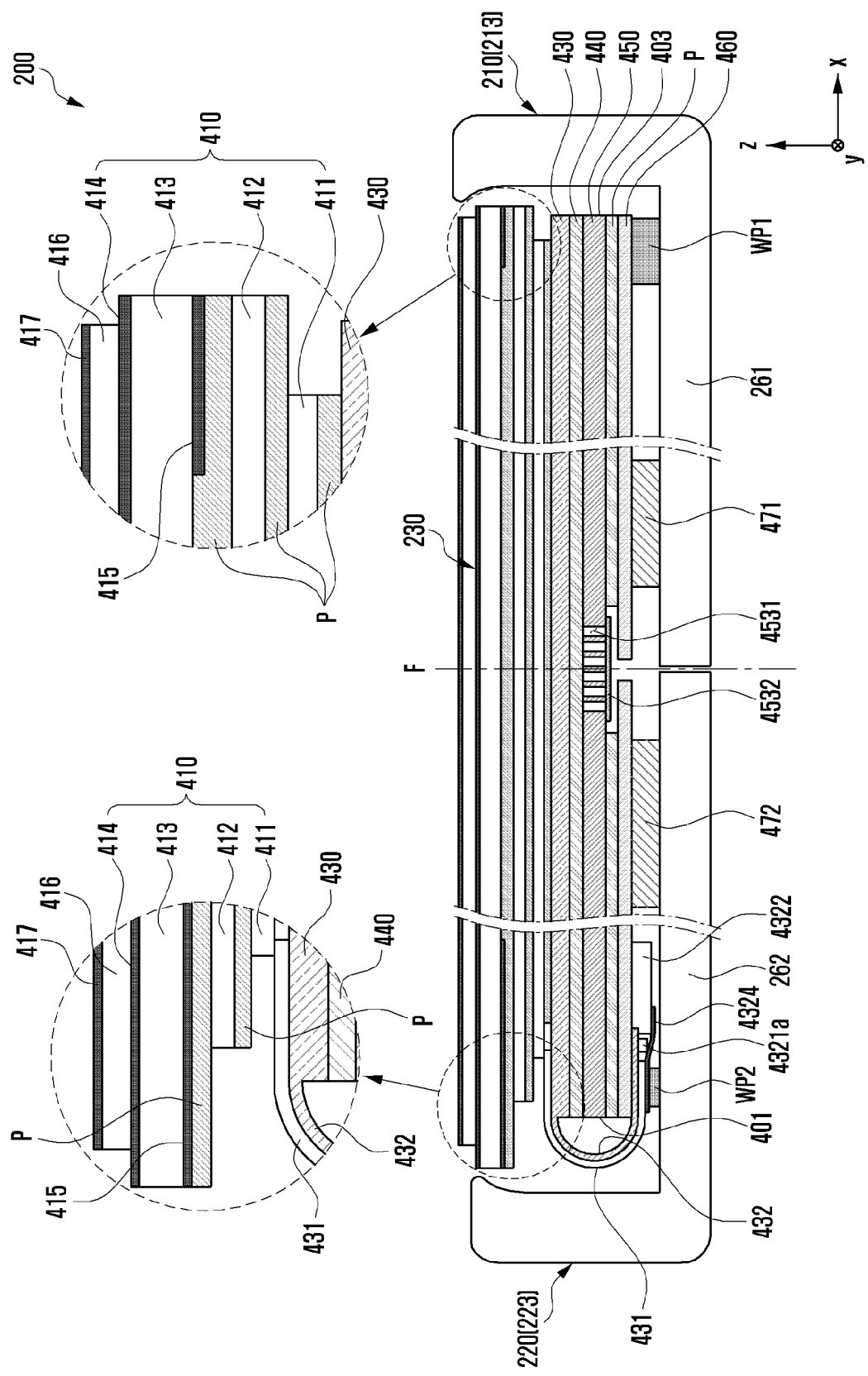

With reference to FIG. 7C, the flexible display 230 may include at least one protection film 416 laminated on the upper part of the protection layer 410. In an embodiment, the protection film 416 may be formed of stretch PET or TPU. In an embodiment, the protection film 416 may be attached to the protection layer 410 through the adhesive member so as to be replaceable when the protection film 416 is contaminated or damaged. In an embodiment, the flexible display 230 may include a coating layer 417 formed on the upper surface of the at least one protection film 416. For example, the coating layer 417 formed on the protection film 416 may be substantially the same as the coating layer 414 formed on the third layer 413.

Figure 7D:
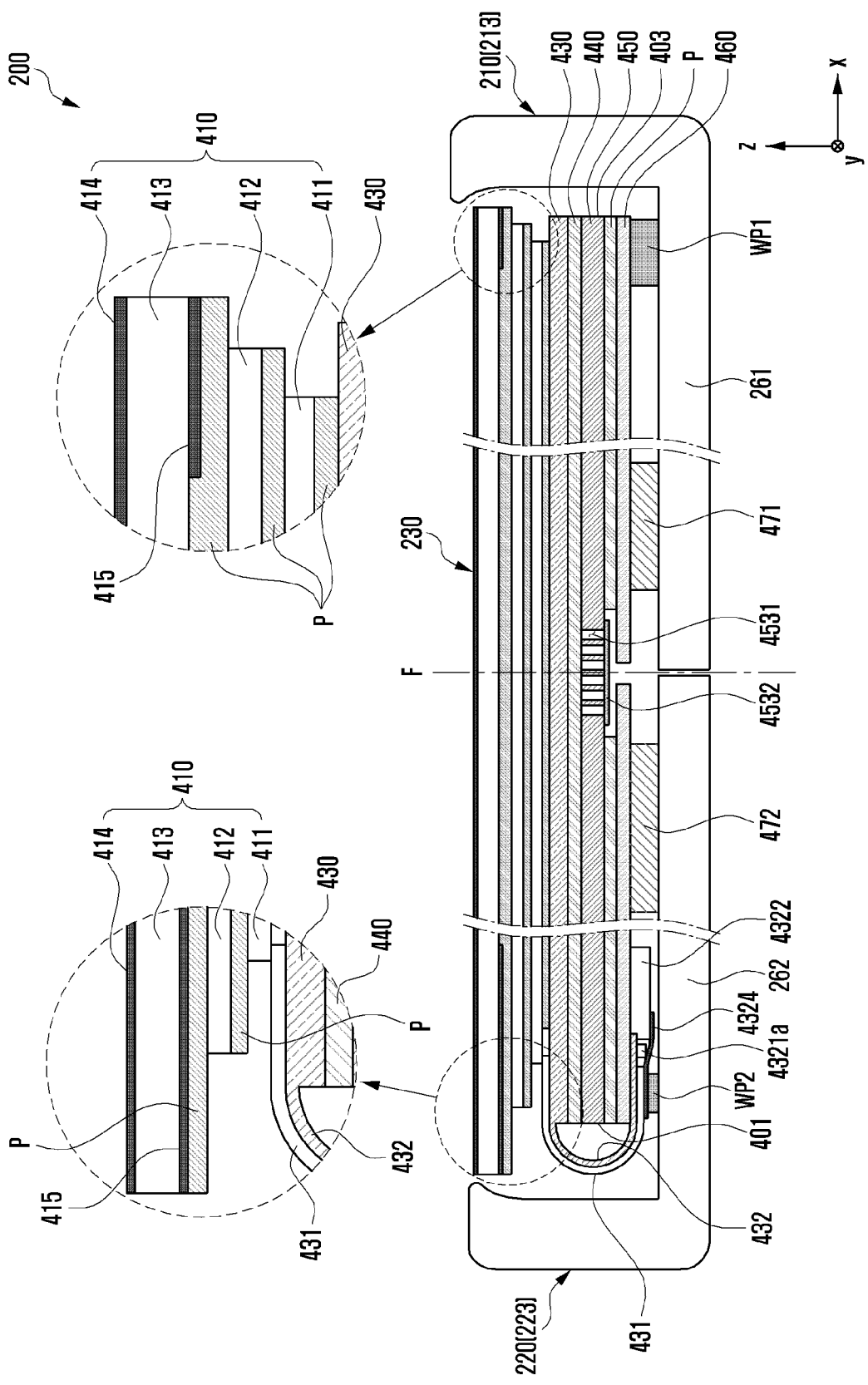

With reference to FIG. 7D, the protection layer 410 may be disposed so that the edge of the second layer 412 does not coincide with the edge of the third layer 413 at the third edge 403 of the flexible display 230. In an embodiment, the protection layer 410 may be formed so that the edge of the third layer 413 is closer to the first lateral member 213 than the edge of the second layer 412. In a certain embodiment, the protection layer 410 may be formed so that the edge of the second layer 412 is closer to the first lateral member 213 than the edge of the third layer 413. In a certain embodiment, the different disposition structure of the edge of the second layer 412 and the edge of the third layer 413 may be applied to at least one of the second edge (e.g., the second edge 402 of FIG. 5A) or the fourth edge (e.g., the fourth edge 404 of FIG. 5A) of the flexible display 230.

Figure 7E:
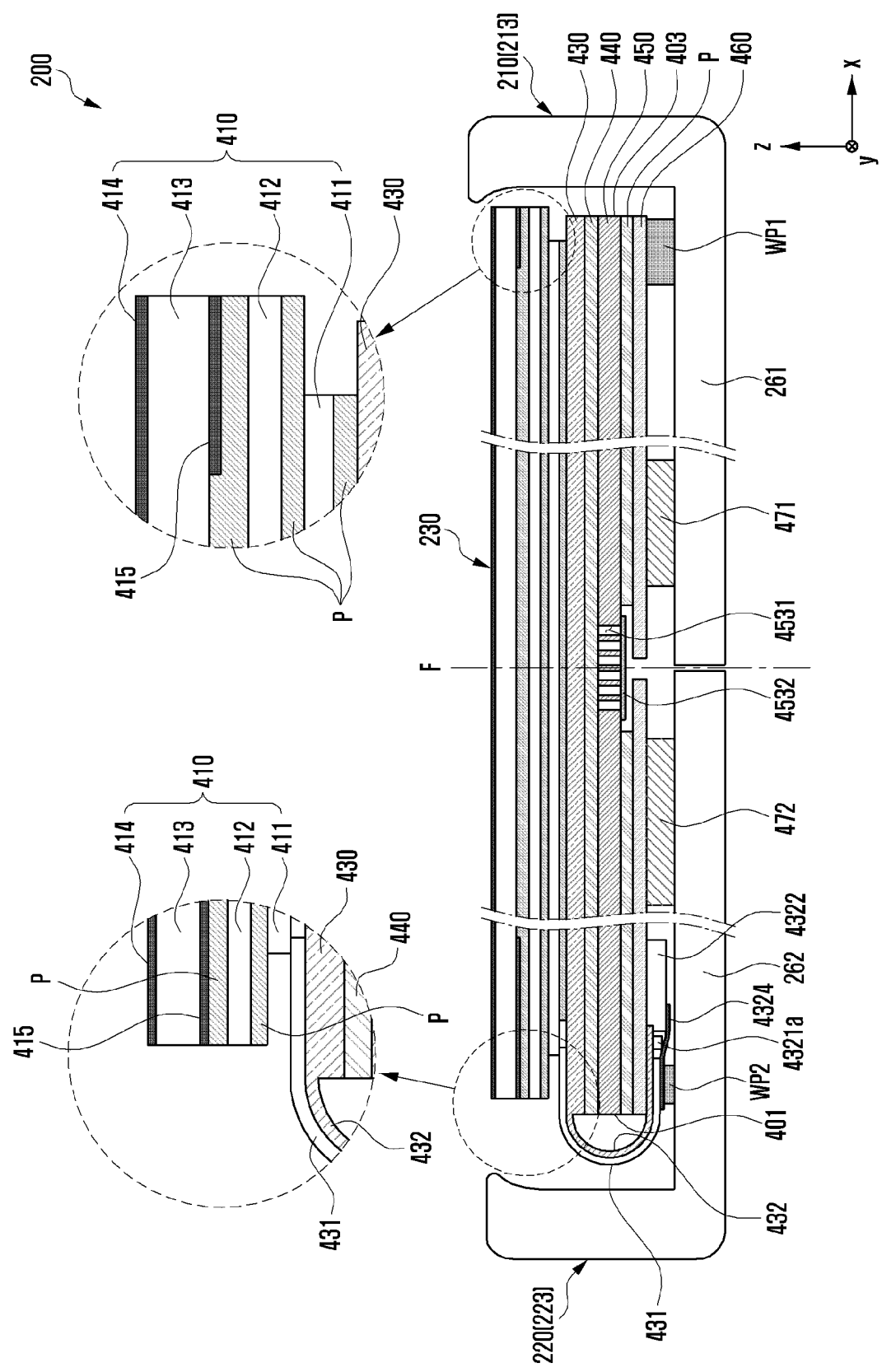

With reference to FIG. 7E, the protection layer 410 may be formed with a size that does not overlap the bending part 432 at the first edge 401, when the flexible display 230 is viewed from above. In this case, the second layer 412 and the third layer 413 of the protection layer 410 may be formed with a size in which the bending part 432 can be viewed at the first edge 401, when the flexible display 230 is viewed from above.

According to various example embodiments, an electronic device (e.g., electronic device 200 of FIG. 6) may include: a first housing (e.g., first housing 210 of FIG. 6); a second housing (e.g., second housing 220 of FIG. 6); a hinge device including a hinge (e.g., hinge device 400 or 400-1 of FIG. 3) connecting the first housing and the second housing in a foldable manner with the first housing based on a folding axis (e.g., folding axis F of FIG. 6) through; and a flexible display (e.g., flexible display 230 of FIG. 6) disposed to be supported by the first housing and the second housing, and including a display panel (e.g., display panel 430 of FIG. 6) and a protection layer (e.g., protection layer 410 of FIG. 6) laminated on the display panel. The protection layer of the flexible display may include a first layer (e.g., first layer 411 of FIG. 6) laminated on the display panel; a second layer (e.g., second layer 412 of FIG. 6) laminated on the first layer; a third layer (e.g., third layer 413 of FIG. 6) laminated on the second layer; and a coating layer (e.g., coating layer 414 of FIG. 6) formed on an upper surface of the third layer, wherein the third layer has a thickness (e.g., thickness t2 of FIG. 6) greater than a thickness (e.g., thickness t1 of FIG. 6) of the second layer.

According to various example embodiments, the first layer may comprise a glass material.

According to various example embodiments, the second layer and/or the third layer may comprise a polymer material.

According to various example embodiments, the second layer may have a thickness equal to or greater than 20 μm.

According to various example embodiments, the third layer may have a thickness equal to or less than 80 μm.

According to various example embodiments, the flexible display may include: a first edge having a first length; a second edge extending in a vertical direction from the first edge, and having a second length; a third edge extending in a direction parallel to the first edge from the second edge, and having the first length; and a fourth edge extending in a direction parallel to the second edge from the third edge to the first edge, and having the second length, wherein the flexible display includes a bending part extending from at least a part of the display panel at the first edge, and bent to a rear surface of the flexible display.

According to various example embodiments, the third layer may be disposed to overlap at least the bending part when the flexible display is viewed from above at the first edge.

According to various example embodiments, the electronic device may include a printed layer disposed to have a width to overlap at least the first edge and the bending part when the flexible display is viewed from above on the rear surface of the third layer.

According to various example embodiments, the printed layer may include a printed layer disposed to have a width to overlap at least the second edge, the third edge, and the fourth edge when the flexible display is viewed from above.

According to various example embodiments, the third layer may be disposed so that an end part thereof coincides with an end part of the second layer when the flexible display is viewed from above at the second edge, the third edge, and the fourth edge.

According to various example embodiments, the third layer may be disposed so that an end part of the third layer coincides with an end part of the second layer when the flexible display is viewed from above at the first edge.

According to various example embodiments, the electronic device may include a printed layer disposed to have a width to overlap at least the first edge and the bending part when the flexible display is viewed from above on a rear surface of the second layer.

According to various example embodiments, the first layer and the second layer may be attached to each other by an adhesive, and the adhesive may be disposed so that an end part of the adhesive coincides with an end part of the first layer.

According to various example embodiments, the coating layer may include at least one of a hard coating (HC) layer, an anti-reflection (AR)/low-reflection (LR) coating layer, a shatterproof (SP) coating layer, and/or an anti-fingerprint (AF) coating layer.

According to various example embodiments, the electronic device may include at least one functional layer disposed under the display panel.

According to various example embodiments, the functional layer may include a reinforcement plate and/or a digitizer.

According to various example embodiments, a flexible display may include: a display panel; and a protection layer laminated on the display panel, wherein the protection layer includes: a first layer laminated on the display panel; a second layer laminated on the first layer; a third layer laminated on the second layer; and a coating layer formed on an upper surface of the third layer, wherein the third layer has a thickness greater than a thickness of the second layer.

According to various example embodiments, the flexible display may include: a first edge having a first length; a second edge extending in a vertical direction from the first edge, and having a second length; a third edge extending in a direction parallel to the first edge from the second edge, and having the first length; and a fourth edge extending in a direction parallel to the second edge from the second edge to the first edge, and having the second length, wherein the flexible display includes a bending part extending from at least a part of the display panel at the first edge, and bent to a rear surface of the flexible display.

According to various example embodiments, the third layer may be disposed to overlap at least the bending part when the flexible display is viewed from above at the first edge.

According to various example embodiments, the third layer may be disposed so that an end part thereof coincides with an end part of the second layer when the flexible display is viewed from above at the second edge, the third edge, and the fourth edge.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a first housing;
    a second housing;
    a hinge device connecting the first housing and the second housing in a foldable manner; and
    a flexible display disposed to be supported by the first housing and the second housing, and including a display panel and a protection layer laminated on the display panel,
    wherein the protection layer includes:
    a first layer laminated on the display panel;
    a second layer laminated on the first layer;
    a third layer laminated on the second layer; and
    a coating layer formed on an upper surface of the third layer,
    wherein the third layer has a thickness greater than a thickness of the second layer.

2. The electronic device of claim 1, wherein the first layer comprises a glass material.

3. The electronic device of claim 1, wherein the second layer and/or the third layer comprises a polymer material.

4. The electronic device of claim 1, wherein the second layer has a thickness equal to or greater than 20 μm.

5. The electronic device of claim 1, wherein the third layer has a thickness equal to or less than 80 μm.

6. The electronic device of claim 1, wherein the flexible display comprises:
    a first edge having a first length;
    a second edge extending in a vertical direction from the first edge, and having a second length;
    a third edge extending in a direction parallel to the first edge from the second edge, and having the first length; and
    a fourth edge extending in a direction parallel to the second edge from the third edge to the first edge, and having the second length,
    wherein the flexible display includes a bending part extending from at least a part of the display panel at the first edge, and bent to a rear surface of the flexible display.

7. The electronic device of claim 6, wherein the third layer is disposed to overlap at least the bending part when the flexible display is viewed from above at the first edge.

8. The electronic device of claim 7, comprising a printed layer disposed to have a width to overlap at least the first edge and the bending part when the flexible display is viewed from above on the rear surface of the third layer.

9. The electronic device of claim 8, wherein the printed layer comprises a printed layer disposed to have a width to overlap at least the second edge, the third edge, and the fourth edge when the flexible display is viewed from above.

10. The electronic device of claim 7, wherein the third layer is disposed so that an end part of the third layer coincides with an end part of the second layer when the flexible display is viewed from above at the second edge, the third edge, and the fourth edge.

11. The electronic device of claim 7, wherein the third layer is disposed so that an end part of the third layer coincides with an end part of the second layer when the flexible display is viewed from above at the first edge.

12. The electronic device of claim 11, comprising a printed layer disposed to have a width to overlap at least the first edge and the bending part when the flexible display is viewed from above on a rear surface of the second layer.

13. The electronic device of claim 1, wherein the first layer and the second layer are attached to each other through an adhesive, and
wherein the adhesive is disposed so that an end part of the adhesive coincides with an end part of the first layer.

14. The electronic device of claim 1, wherein the coating layer comprises at least one of a hard coating (HC) layer, an anti-reflection (AR)/low-reflection (LR) coating layer, a shatterproof (SP) coating layer, or/and an anti-fingerprint (AF) coating layer.

15. The electronic device of claim 1, comprising at least one functional layer disposed under the display panel.

16. The electronic device of claim 15, wherein the functional layer comprises a reinforcement plate and/or a digitizer.

17. A flexible display comprising:
a display panel; and
a protection layer laminated on the display panel,
wherein the protection layer includes:
a first layer laminated on the display panel;
a second layer laminated on the first layer;
a third layer laminated on the second layer; and
a coating layer formed on an upper surface of the third layer,
wherein the third layer has a thickness greater than a thickness of the second layer.

18. The flexible display of claim 17, wherein the flexible display comprises:
a first edge having a first length;
a second edge extending in a vertical direction from the first edge, and having a second length;
a third edge extending in a direction parallel to the first edge from the second edge, and having the first length; and
a fourth edge extending in a direction parallel to the second edge from the third edge to the first edge, and having the second length,
wherein the flexible display includes a bending part extending from at least a part of the display panel at the first edge, and bent to a rear surface of the flexible display.

19. The flexible display of claim 18, wherein the third layer is disposed to overlap at least the bending part when the flexible display is viewed from above at the first edge.

20. The electronic device of claim 18, wherein the third layer is disposed so that an end part of the third layer coincides with an end part of the second layer when the flexible display is viewed from above at the second edge, the third edge, and the fourth edge.

\* \* \* \* \*